(12) United States Patent
Hirakawa et al.

(10) Patent No.: US 6,515,230 B1
(45) Date of Patent: Feb. 4, 2003

(54) NOISE ABSORBER AND CASE FOR NOISE ABSORBER

(75) Inventors: Masaharu Hirakawa, Tokyo (JP); Yuetsu Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/517,573

(22) Filed: Mar. 2, 2000

(30) Foreign Application Priority Data

Mar. 24, 1999 (JP) .......................................... 11-080606

(51) Int. Cl.⁷ .............................................. H01F 27/02
(52) U.S. Cl. ............................... 174/92; 336/92; 333/12
(58) Field of Search ...................... 174/92, 36; 336/92, 336/65, 174, 175, 176; 333/12; 324/17

(56) References Cited

U.S. PATENT DOCUMENTS 3,127,471 A * 3/1964 Greiner ...................... 174/135
3,147,338 A * 9/1964 Ekvall et al. ............. 174/138 F
4,825,185 A 4/1989 Matsui
4,873,505 A * 10/1989 Matsui ........................ 324/127
4,885,559 A 12/1989 Nakano

FOREIGN PATENT DOCUMENTS

JP          6-060117          8/1994

* cited by examiner

Primary Examiner—Chau N. Nguyen
(74) Attorney, Agent, or Firm—Oblon, Spivak, McClelland, Maier & Neustadt, P.C.

(57) ABSTRACT

A case for a noise absorber including a first case member and a second case member. The first case member includes a first cable guide and a second cable guide at opposite sides and a first core housing provided therebetween. The second case member includes a third cable guide and a fourth cable guide at opposite sides and a second core housing provided therebetween. The first case member and the second case member are interlocked and a hinge arrangement movably connects one of the sides of the first case member with one of the sides of the second case member. A magnetic core having a cable through passage can be housed inside the case to provide a noise absorber.

18 Claims, 29 Drawing Sheets

NOISE ABSORBER AND CASE FOR NOISE ABSORBER

BACKGROUND OF THE INVENTION

1. Field of the Invention

The present invention relates to a noise absorber and a case for a noise absorber.

2. Discussion of Background

Numerous noise absorbers fulfilling similar noise absorbing functions have been proposed and put into practical use to date. One of the well-known noise absorbers employs an insulating resin to securely mold a magnetic core onto a cable. This noise absorber is, however, not user-friendly since in order to mount the noise absorber onto a cable, implementation of a burdensome and expensive molding process is necessary.

Noise absorbers which employ split ferrite cores disposed in a holding case that comprises two case members connected by a hinge and secured by a means for interlocking are disclosed in, for example, U.S. Pat. Nos. 4,825,185 and 4,885,559. The hinge and the means for interlocking are situated so as to face each other at external circumferencial surfaces of the holding case. The split ferrite cores are in close contact with each other by taking advantage of a resiliency that manifests when the case members are secured so that a substantially closed, cylindrical magnetic circuit is achieved.

However, with the noise absorbers described above, the resiliency, manifesting itself when the case members are secured, is applied to both the hinge and the means for interlocking. Thus, when these noise absorbers are used over a substantial period, the mechanical strength of the hinge and the means for interlocking deteriorates, eventually resulting in a partial or complete separation of the case members.

Moreover, since these noise absorbers employ split ferrite cores, when the mechanical strength of the hinge and the means for interlocking deteriorates, a gap appears between the split ferrite cores, diminishing the noise absorbing characteristics.

Also, since the means for interlocking is situated at the exterior of the holding case, additional mounting space is required to accommodate projections of the means for interlocking and this is particularly disadvantageous when space for installing the noise absorber is limited.

In another example of the prior art technology, Japanese Unexamined Utility Model Publication No. 60117/1994 discloses a noise absorber that employs a single cylindrical magnetic core enclosed by two separate case members. The cable onto which the noise absorber is to be mounted, is inserted through the cylindrical magnetic core after which it is wound around the cylindrical magnetic core once. One of the two case members has indented portions while the other of the two case members has projections that face opposite the indented portions. The two case members are secured by interlocking the projections with the indented portions.

In this example, the end user is supplied with a noise absorber of which a cylindrical magnetic core is enclosed by secured case members, so the two case members have to be separated from each other in order to remove the cylindrical magnetic core, insert and wind the cable around the cylindrical magnetic core and then reassemble the two case members. This imposes an extremely troublesome burden on the end user.

SUMMARY OF THE INVENTION

It is an object of the present invention to provide a noise absorber and a case for a noise absorber that reduce the load placed upon the hinge arrangement and the means for interlocking.

It is a further object of the present invention to provide a noise absorber and a case for a noise absorber being compact and possible to mount on a cable where mounting space is limited.

It is a still further object of the present invention to provide a noise absorber and a case for a noise absorber being easy to assemble and easy to attach to a cable.

In order to achieve the objects described above, the present invention discloses a noise absorber and a case for a noise absorber in two modes.

The case in the first mode according to the present invention comprises a first case member, a second case member, a means for interlocking and a hinge arrangement.

The first case member has two opposite sides and includes a first cable guide at one of the two opposite sides of the first case member and a second cable guide at another of the two opposite sides of the first case member, with a first core housing provided between the opposite sides of the first case member. The second case member has two opposite sides and includes a third cable guide at one of the two opposite sides of the second case member and a fourth cable guide at another of the two opposite sides of the second case member, with a second core housing provided between the opposite sides of the second case member.

The means for interlocking secures the first case member and the second case member, and the hinge arrangement movably connects one of the opposite sides of the first case member with one of the opposite sides of the second case member.

The case in the first mode according to the present invention comprises first and second case members each including a core housing. This structure allows a magnetic core to be housed entirely in said case by housing half of the magnetic core inside the first core housing of the first case member and housing the other half of the magnetic core into the second core housing of the second case member and by closing the first and second case members together. Thus, the case, used in combination with a magnetic core, constitutes the noise absorption apparatus.

The noise absorber of the present invention can be mounted on a cable of an electronic device to absorb noise generated inside or outside the electronic device by guiding the cable through apertures formed by the first and fourth cable guides and the second and third cable guides, and the cable through passage of the magnetic core, thereby facilitating the cable insertion process.

In addition, the case is secured by the means for interlocking after a cable is passed through the cable through passage of the magnetic core, so that resin molding becomes unnecessary, thereby enabling the end user to mount the noise absorber on a cable.

Moreover, the first and second case members are movably connected by a hinge arrangement on one side of the case and secured by the means for interlocking at the other side of the case, so the main function that the hinge arrangement and the means for interlocking must fulfill is holding the magnetic core. Thus, the load placed on the hinge arrangement and the means for interlocking is greatly reduced.

Therefore, the case and noise absorber according to the present invention are much different from the case and noise absorber disclosed in the prior art, in which a pair of split ferrite cores are placed in close contact with each other by using the resiliency of the case.

Furthermore, when the first and second case members are secured, the hinge arrangement projects out in the lengthwise direction of the case which conforms with the direction of the cable, so that the external dimension of the noise absorber according to the present invention is less than that of the noise absorber disclosed in the prior art. While the external dimension of the case increases by the distance over which the hinge arrangement projects out, this increase does not present any problem, since the cable extends out at two sides in the lengthwise direction of the case.

The case in the second mode according to the present invention comprises a first case member, a second case member, a first means for interlocking and a second means for interlocking.

The first case member has two opposite sides and includes a first cable guide at one of the two opposite sides of the first case member and a second cable guide at another of the two opposite sides of the first case member, with a first core housing provided between the opposite sides of the first case member. The second case member has two opposite sides and includes a third cable guide at one of the two opposite sides of the second case member and a fourth cable guide at another of the two opposite sides of the second case member, with a second core housing provided between the opposite sides of the second case member.

The first means for interlocking and the second means for interlocking secure the first and second case members, with the first means for interlocking securing the first and second case members partially, and the second means for interlocking securing the first and second case members entirely.

With this structure, when the first and second case members are secured either partially or entirely, the first and fourth cable guides face each other and form an aperture.

Similarly, when the first and second case members are secured either partially or entirely, the second and third cable guides face each other and form an aperture.

The case in the second mode comprises first and second case members each including a core housing. This structure allows a magnetic core to be housed entirely in said case by housing half of the magnetic core inside the first core housing of the first case member and housing the other half of the magnetic core into the second core housing of the second case member and by closing the first and second case members together. The noise absorber thus achieved can be mounted on a cable of an electronic device to absorb noise generated inside or outside the electronic device by guiding the cable through apertures formed by the first and fourth cable guides and the second and third cable guides, and the cable through passage of the magnetic core, thereby facilitating the cable insertion process.

The first means for interlocking latches the first and second case members partially and, as a result, apertures through which a cable can be inserted are formed. The noise absorber can be sold in a state in which the first and second case members are partially latched. Thus, when mounting the noise absorber onto a cable, the end user can insert a cable through the noise absorber in a state in which it was purchased.

In addition, the second means for interlocking latches the first and second case member entirely. This allows the end user to mount the noise absorber onto a cable with a high degree of reliability at a very slight angle of displacement relative to the partially latched state achieved by the first means for interlocking. Consequently, the noise absorber in the second mode can be mounted onto a cable quickly and easily.

BRIEF DESCRIPTION OF THE DRAWINGS

A more complete appreciation of the invention and many of the attendant advantages thereof become better understood when referring to the following detailed description of the accompanied drawings, in which.

DETAILED DESCRIPTION OF THE PREFERRED EMBODIMENTS

Figure 1:
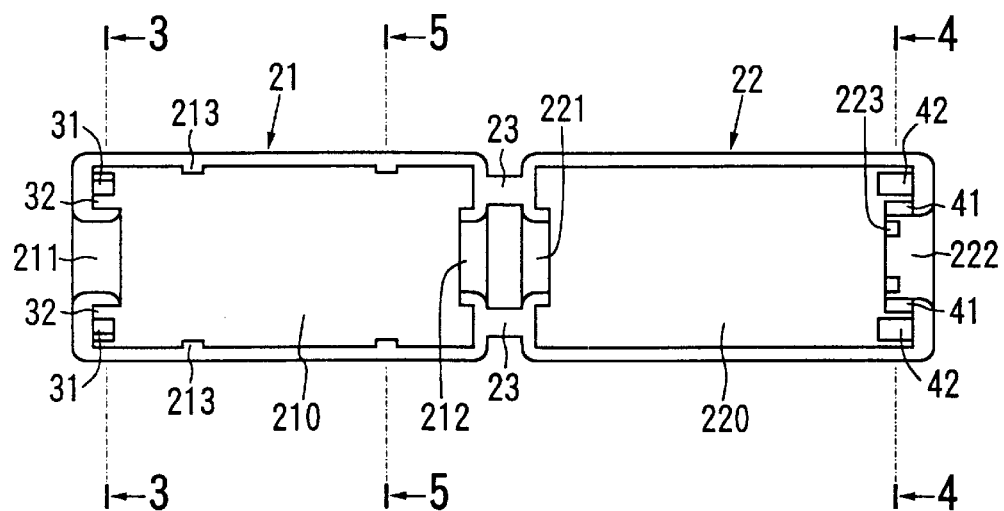
FIG. 1 is a plan view illustrating an unlatched case in a preferred embodiment.
Figure 2:
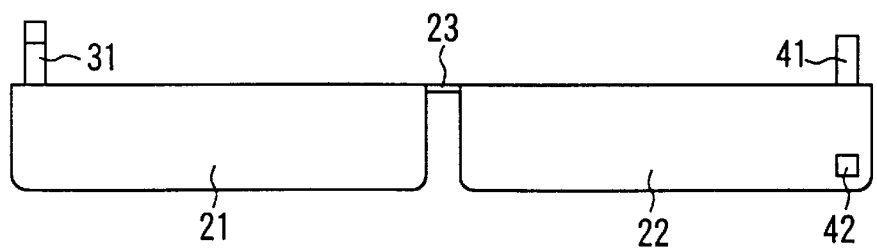
FIG. 2 is a frontal view illustrating the case of FIG. 1

FIGS. 1 to 9 illustrate a case in both the first and second mode according to the present invention. In other words, a case that includes a hinge arrangement and a first and second means for interlocking is illustrated here. The first case member 21, which is formed in a split cylindrical shape, includes a first core housing 210 having one open end. The second case member 22, which is also formed in a split cylindrical shape, includes a second core housing 220 having one open end. The open end of the first case member 21 and the open end of the second case member 22 face each other when closing the case.

A first cable guide 211 and a second cable guide 212 are provided at opposite sides in the lengthwise direction of the first case member 21. A third cable guide 221 and a fourth cable guide 222 are provided at opposite sides in the lengthwise direction of the second case member 22. When closing the case, the opposite sides of the first case member 21 are flush with the opposite sides of the second case member 22 so that the first cable guide 211 and the fourth cable guides 222 face each other, and the second cable guide 212 and third cable guide 221 face each other so that apertures at two diametrical sides of the case are formed.

The first case member 21 is provided with four projections 213 at the open end of the first core housing 210. These projections 213 are provided to retain a magnetic core. The number of projections 213 is arbitrary, but it is desirable to retain the magnetic core with projections 213 at least at diagonal points. The projections 213 are provided at the first case member 21 on the assumption that a single cylindrical magnetic core is to be housed in the first core housing 210. It is obvious that the second case member 22 should be provided with projections 213 at the open end of the second core housing 220 if a cylindrical magnetic core is to be housed in the second core housing 220, and that the projections 213 should be provided at both the open end of the first core housing 210 and the open end of the second core housing 220 if split cores are to be employed.

In the figures, the fourth cable guide 222 of the second case member 22 is provided with a plurality of cable clamp portions 223 to prevent the noise absorber from moving along the cable after having been mounted. The cable clamp portions 223 in the figures merely represent an example and may take various forms other than that shown in the figures and may be provided in a sawtooth shape or constituted by changing, for instance, the curvature of the fourth cable guide 222. Only one or a plurality of cable clamp portions 223 may be provided at either the first cable guide 211 or the fourth cable guide 222, or at both the first cable guide 211 and the fourth cable guide 222. In an alternative embodiment of the case, the side of the first case member 21 where the second cable guide 212 is provided, is connected to the side of the second case member 22 where the fourth cable guide 222 is provided. Here, only one or a plurality of cable clamp portions 223 may be provided at either the first cable guide 211 or the third cable guide 221, or at both the first cable guide 211 and the third cable guide 221.

In the figures, the hinge arrangement 23 is provided at both sides of the second cable guide 212 and the third cable guide 221 and movably connects one of the sides of the first case member 21 to one of the sides of the second case member 22. The hinge arrangement 23 is integrally formed with the first case member 21 and the second case member 22 and is made to demonstrate a degree of flexibility by selecting an appropriate thickness. The first case member 21, the second case member 22 and the hinge arrangement 23 are all constituted of a material such as plastic.

Furthermore, when the first and second case members 21 and 22 are secured, the hinge arrangement 23 projects out in the lengthwise direction of; the case, so that the external diameter of the case according to the present invention is less than that of the case of the noise absorber disclosed in the prior art.

In addition, one end of the first case member 21 is provided with first hooks 31 and first holes 32. The first holes 32 are each provided on either side of the first cable guide 211 and the first hooks 31 are each provided on the outside of the first holes 32.

Similarly, one end of the second case member 22 is provided with second hooks 41 and second holes 42. The second hooks 41 are each provided on either side of the fourth cable guide 222 at a position corresponding to that of the first holes 32, and the second holes 42 are each provided on the outside of a second hook 41 at a position corresponding to that of the first hooks 31.

Figure 3:
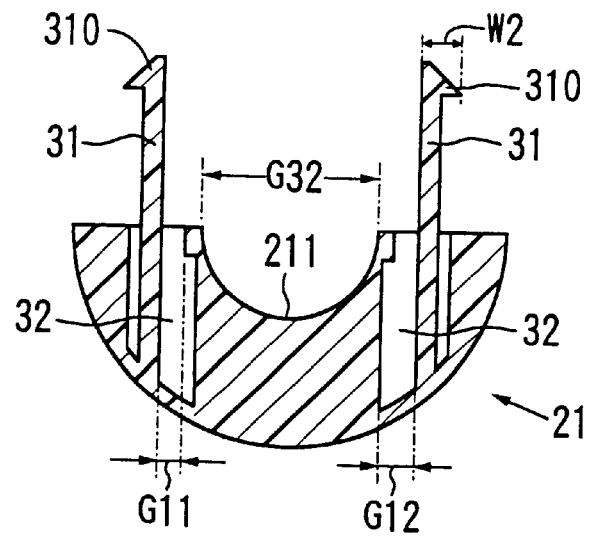
FIG. 3 is an enlarged sectional view taken along line 3—3 in FIG. 1.
Figure 4:
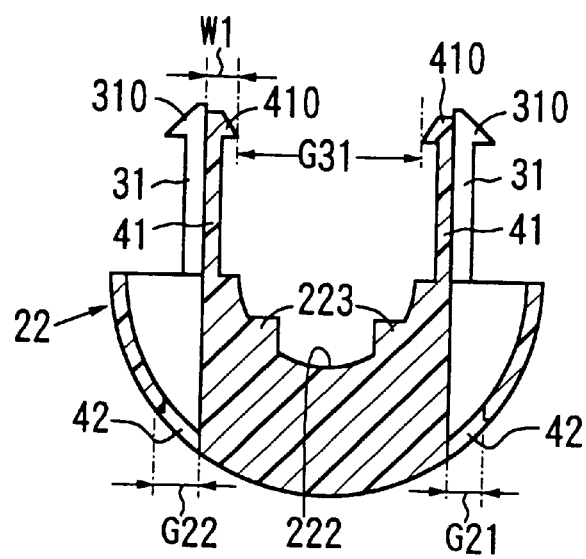
FIG. 4 is an enlarged sectional view taken along line 4—4 in FIG. 1.
Figure 5:
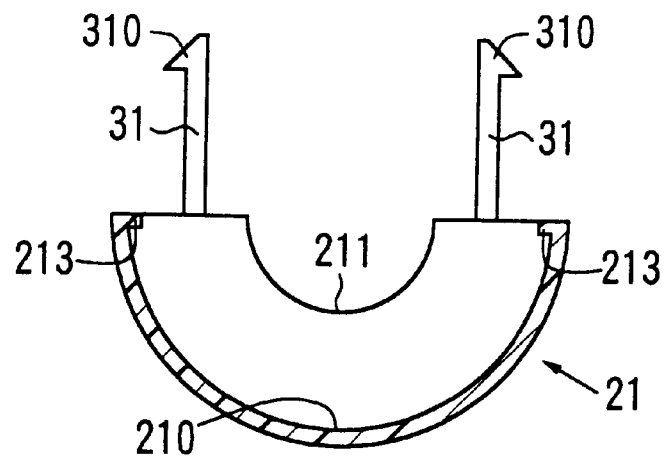
FIG. 5 is an enlarged sectional view taken along line 5—5 in FIG. 1.

Referring to FIGS. 3 and 4, a clearance G11 at the insertion opening of each first hole 32, is set smaller than the internal clearance G12. The second hooks 41 are each provided with a projecting piece 410. The width W1 of the projecting pieces 410 is larger than the clearance G11 at the insertion opening of the first holes 32 and is set roughly equal to the internal clearance G12 of the first holes 32. The distance G31 between the projecting pieces 410 is set slightly smaller than the distance G32 between the first holes 32. The clearance G21 at the insertion opening of each second hole 42 is set smaller than the clearance G22 at the exit of each second hole 42. The first hooks 31 are each provided with a projecting piece 310. The width W2 of the projecting pieces 310 is larger than the clearance G21 at the insertion opening of each second hole 42 and is set roughly equal to the clearance G22 at the exit of each second hole 42.

Figure 6:
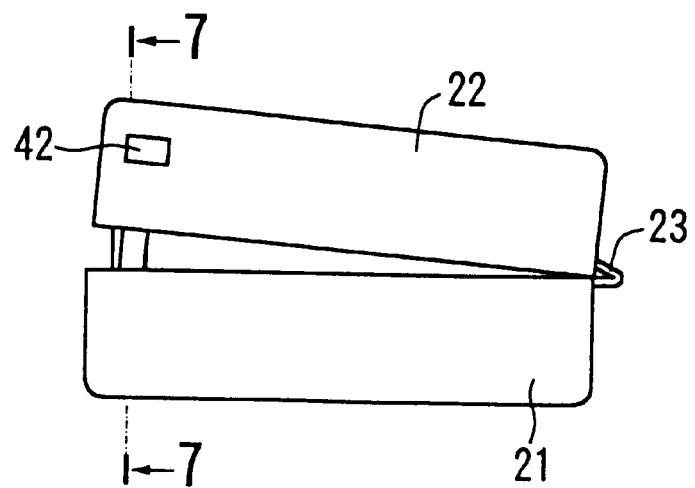
FIG. 6 is a frontal view illustrating the case of FIG. 1, in a semi-latched state.
Figure 7:
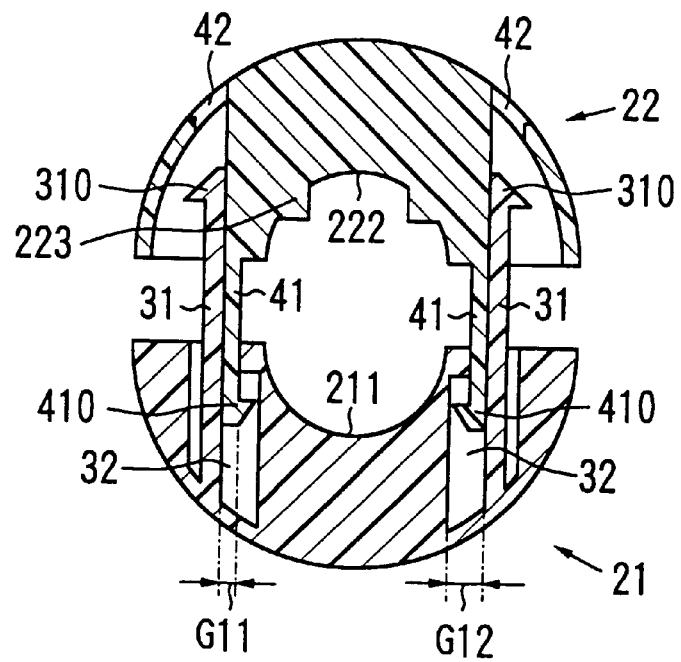
FIG. 7 is an enlarged sectional view taken along line 7—7 in FIG. 6.
Figure 8:
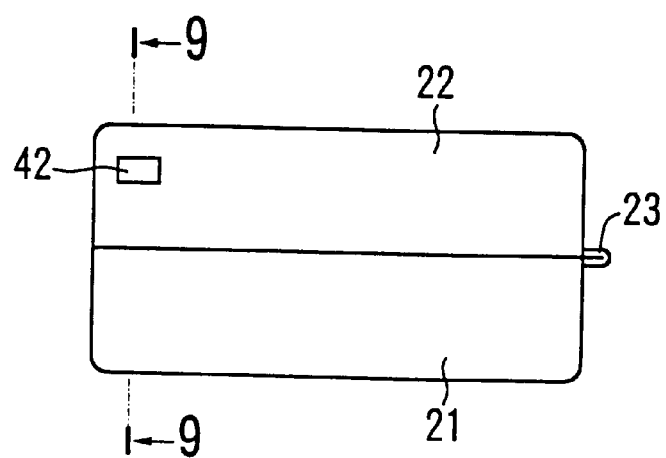
FIG. 8 is a frontal view illustrating the case of FIG. 1, in a fully latched state.
Figure 9:
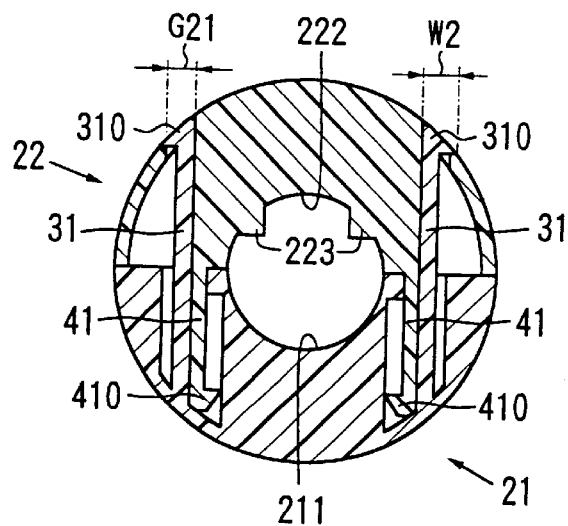
FIG. 9 is an enlarged sectional view taken along line 9—9 in FIG. 8.
Figure 10:
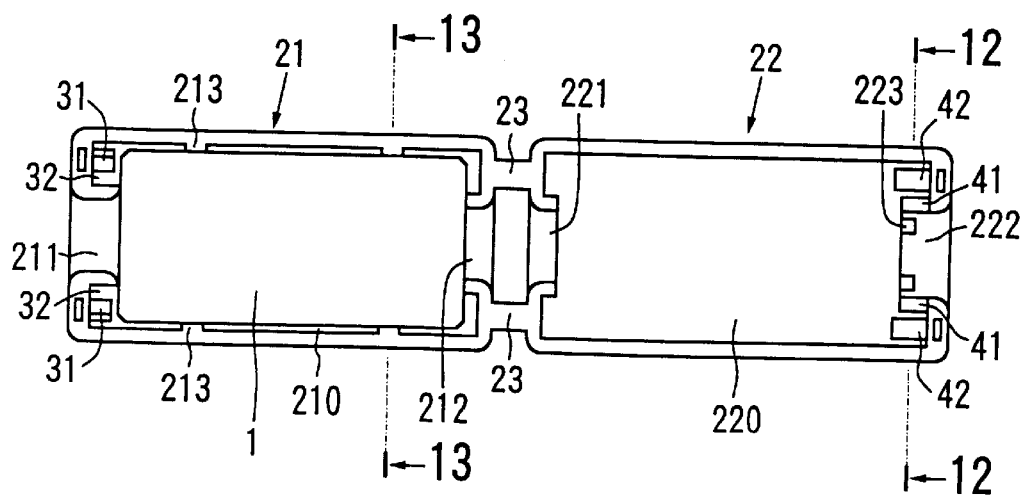
FIG. 10 is a plan view illustrating an unlatched noise absorber in a preferred embodiment.
Figure 11:
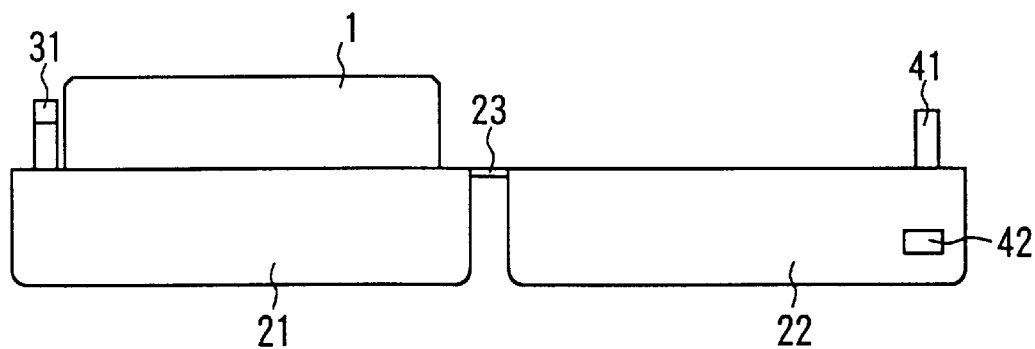
FIG. 11 is a frontal view illustrating the noise absorber of FIG. 10.
Figure 12:
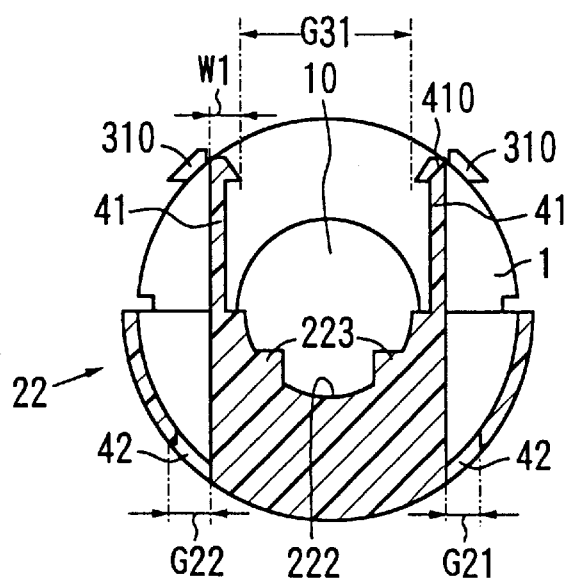
FIG. 12 is an enlarged sectional view taken along line 12—12 in FIG. 10.
Figure 13:
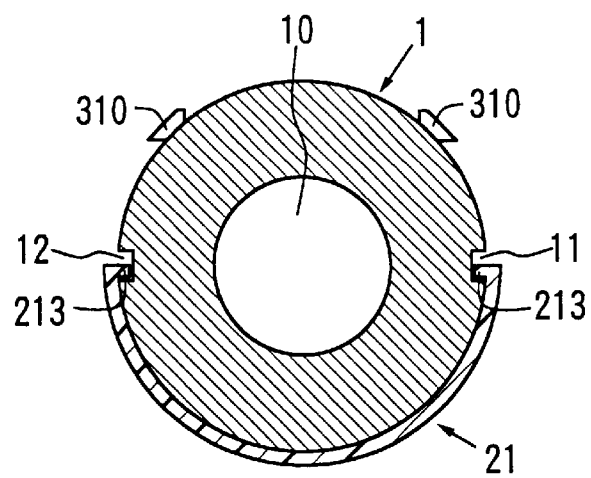
FIG. 13 is an enlarged sectional view taken along line 13—13 in FIG. 10.
Figure 14:
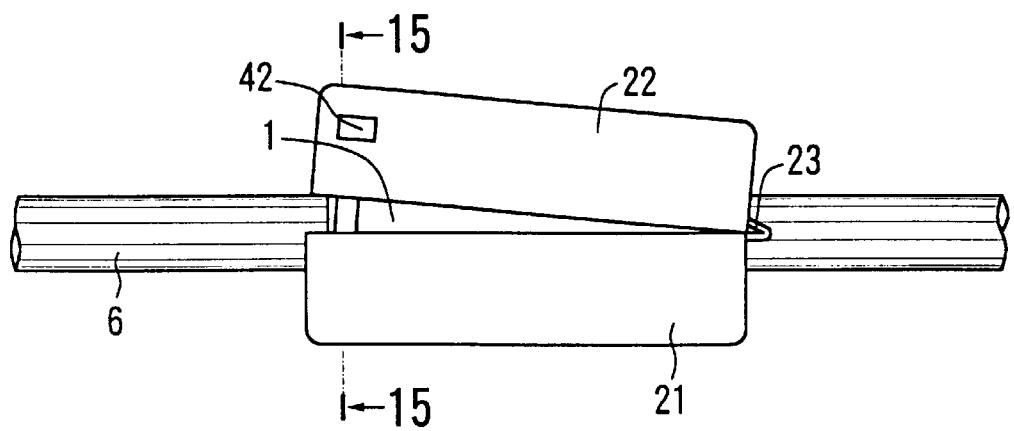
FIG. 14 is a frontal view illustrating the noise absorber of FIG. 10, semi-latched onto a cable.

FIGS. 6 and 7 illustrate a semi-latched case and FIGS. 8 and 9 illustrate a fully latched case. The first means for interlocking and the second means for interlocking are provided on a side of the case opposite from where the hinge arrangement 23 is provided, to secure the first case member 21 and the second case member 22.

Now, in reference to FIGS. 6 to 9, the first means for interlocking and the second means for interlocking are explained. As illustrated in FIGS. 6, and 7, the first means for interlocking semi-latches the first case member 21 and the second case member 22, with the first means for interlocking being constituted of the second hooks 41 at the interior of the second case member 22 and the first holes 32 at the interior of the first case member 21.

As explained previously, the width W1 of the projecting pieces 410 of the second hooks 41 is set larger than the clearance G11 at the insertion openings of the first holes 32. However, the second hooks 41, which are constituted of a material such as plastic, achieve resiliency and flexibility. As a result, although the clearance G11 at the first holes 32 is smaller than the width W1 of the projecting pieces 410, the projecting pieces 410 can be caused to bend due to their resiliency and flexibility so that the projecting pieces 410 are pushed inside the first holes 32 to latch the projecting pieces 410 at the first holes 32, when inserting the second hooks 41 into the first holes 32.

After the projecting pieces 410 are latched at the first holes 32, the restoring force to regain the original shape goes into action at the projecting pieces 410. Since the clearance G11 at the first holes 32 is smaller than the width W1 of the projecting pieces 410, the projecting pieces 410 do not slip out of the first holes 32, when the projecting pieces 410 have regained their original shape.

Since the hinge arrangement achieves resiliency and flexibility, the restoring force to cause the first case member 21 and the second case member 22 to return to an open state acts at the first case member 21 and the second case member 22 connected by the hinge arrangement. Furthermore, since the distance G31 between the projecting pieces 410 is set slightly smaller than the distance G32 between the first holes 32 (see FIGS. 3 and 4), the projecting pieces 410 which are pressed against and in contact with the internal wall surfaces of the first holes 32, are subject to frictional force. These two forces prevent inward movement of the projecting pieces 410 of the second hooks 41 in the first holes 32.

The second means for interlocking latches the first case member 21 and the second case member 22 fully, with the second means for interlocking being constituted of the first hooks 31 at the interior of the first case member 21 and the second holes 42 at the interior of the second case member 22.

As explained previously, the width W2 of the projecting pieces 310 at the first hooks 31 is set larger than the clearance G21 of the second holes 42. However, the first hooks 31, which are constituted of a material such as plastic, achieve resiliency and flexibility. As a result, although the clearance G21 at the second holes 42 is smaller than the width W2 of the projecting pieces 310, the projecting pieces 310 can be caused to bend due to their flexibility so that the projecting pieces 310 are pushed inside the second holes 42 to latch the projecting pieces 310 at the second holes 42, when inserting the first hooks 31 in the second holes 42.

After the projecting pieces 310 are latched at the second holes 42, the projecting pieces 310 regain their original shape due to their own resiliency. Since the clearance G21 at the second holes 42 is smaller than the width W2 of the projecting pieces 310, the projecting pieces 310 do not slip out of the second holes 42 when the projecting pieces 310 have regained their original shape. Thus, the first case member 21 and the second case member 22 maintain fully latched.

FIGS. 10 to 13 illustrate a noise absorber in both the first and second mode according to the present invention. In other words, a noise absorber having a case that includes a hinge arrangement and a first and second means for interlocking is illustrated here. A magnetic core 1 in combination with the case as described in reference to FIGS. 1 to 9 constitutes this noise absorber.

The magnetic core 1 has a cable through passage 10 and is housed in the first core housing 210 of the first case member 21. The magnetic core 1 may be constituted of, for instance, any of various magnetic materials including ferrite magnetic materials, metallic magnetic materials and composite magnetic materials. Examples of such composite magnetic materials include a composite material achieved by blending ferrite particles or metallic magnetic particles with a synthetic resin. A selection may be made as appropriate from these magnetic materials in correspondence to the frequency component of the noise to be absorbed.

The magnetic core 1 is provided with a pair of recessed grooves 11 and 12 at its external circumferential surface. In this structure, when the magnetic core 1 is inserted inside the first core housing 210 of the first case member 21, the projections 213 each become bent due to their own resiliency, flexibility and the like to retain the magnetic core 1 into the first core housing 210. When the magnetic core 1 is perfectly positioned inside the first core housing 210, the projections 213 restore their original shape due to their resiliency to become hooked at the recessed grooves 11 and 12. As a result, the magnetic core 1 is held inside the first core housing 210 with a high degree of stability so that it is prevented from rotating, swinging or slipping with a high degree of reliability.

As explained previously, the first case member 21 and the second case member 22, which are each formed in a split cylindrical shape, are internally provided with the first and second core housings 210 and 220 respectively. The magnetic core 1 is housed and retained in the first core housing 210 at the first case member 21. Since the lower half of the magnetic core 1 is housed in the first case member 21 in this manner, the upper half of the magnetic core 1 becomes housed inside the second case member 22 when the first case member 21 and the second case member 22 are latched.

By employing the cylindrical magnetic core 1 in the noise absorber according to the present invention, various problems posed by the use of split cores are eliminated and a highly economical noise absorber can be manufactured at a low production cost. The noise absorber thus achieved can be mounted on a cable of an electronic device to absorb noise generated inside the electronic device or noise generated outside and transmitted to the electronic device through the cable.

FIGS. 14 to 18 illustrate the mounting process of the noise absorber described with reference to FIGS. 10 to 13. In the noise absorber according to the present invention, the first means for interlocking semi-latches the first case member 21 and the second case member 22. Since this structure allows the magnetic core 1 to be held by the first case member 21 and the second case member 22 in a stable manner even when the positions of the first case member 21 and the second case member 22 are reversed vertically, for instance, the noise absorber can be shipped in this state as a product to be marketed. In addition, since apertures are formed between the cable guides, a cable can be inserted through the noise absorber in the purchased state.

Figure 15:
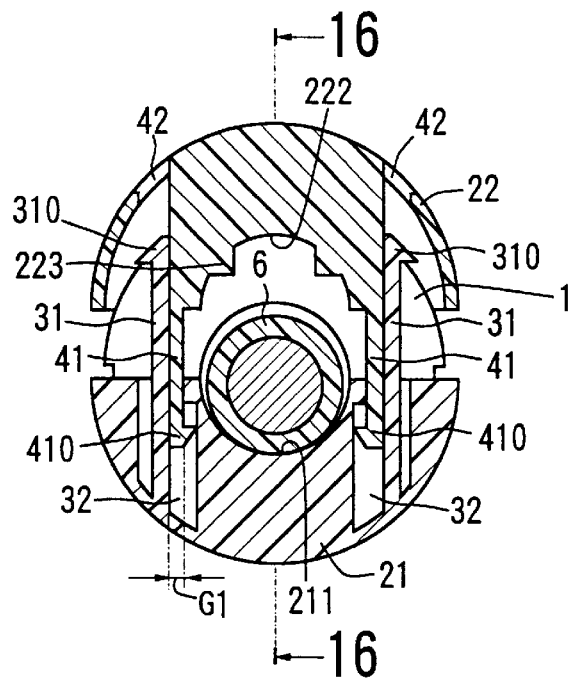
FIG. 15 is an enlarged sectional view taken along line 15—15 in FIG. 14.

Referring to FIG. 15, the cable clamp portions 223 at the fourth cable guide 222 are located outside the cable through passage 10 of the magnetic core 1 in this state. As a result, the insertion of the cable into the noise absorber is not hindered by the presence of the cable clamp portions 223.

Figure 16:
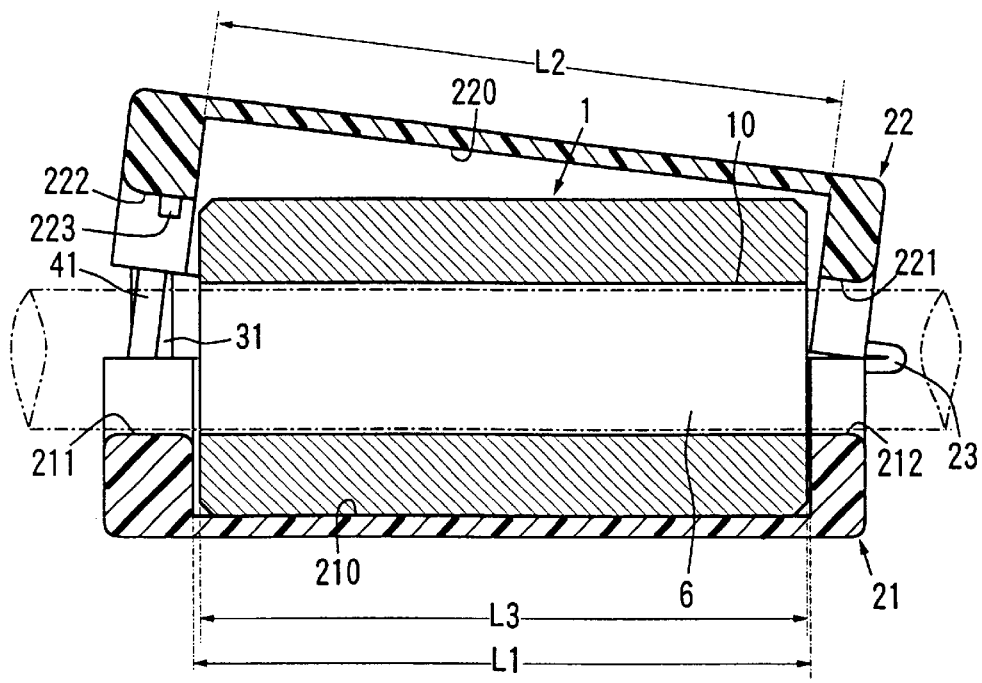
FIG. 16 is an enlarged sectional view taken along line 16—16 in FIG. 15.

Referring to FIG. 16, the length L1 of the first core housing 210 at the first case member 21 is set roughly equal to the length L3 of the magnetic core 1. This structure prevents any defects, i.e., the so- called music- box defect, from occurring as a result of the magnetic core 1 moving inside the first core housing 210 to come in contact with the internal wall surface of the first core housing 210.

The length L2 of the second core housing 220 at the second case member 22 is larger than the length L1 of the first core housing 210. The difference between the length L1 and the length L2 is set to ensure that when the second case member 22 is rotated relative to the first case member 21, the second case member 22 does not impact the magnetic core, resulting in a hindrance to its rotating movement over a range that includes the unlatched state and the latched state achieved by the first means for interlocking. In this embodiment, the dimensional difference is set at approximately 1 mm.

Figure 17:
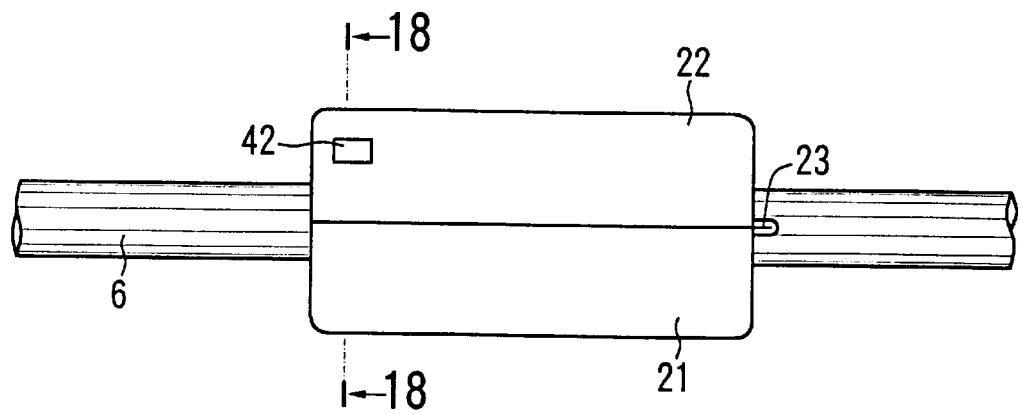
FIG. 17 is a frontal view illustrating the noise absorber of FIG. 10, fully-latched onto a cable.
Figure 18:
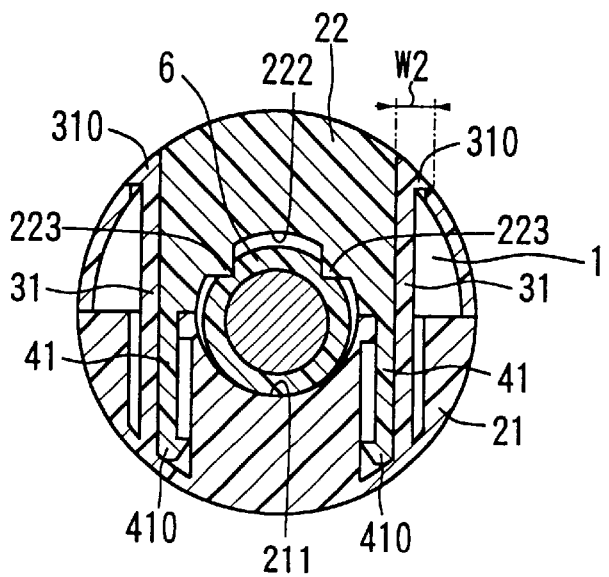
FIG. 18 is an enlarged sectional view taken along line 18—18 in FIG. 17.

Referring to FIGS. 17 and 18, the noise absorber is further provided with a second means for interlocking located at a position facing opposite the hinge arrangement 23 to fully latch the first case member 21 and the second case member 22. This structure allows the end user to fix the noise absorber onto the cable in a reliable manner at a very slight angle of displacement relative to the semi-latched state achieved by the first means for interlocking. In this embodiment, the angle of displacement occurring at this point is approximately 20° to 40°.

The cable clamp portions 223 at the fourth cable guide 222 grip the cable in the noise absorber to prevent the noise absorber from moving along the cable. Thus, the noise absorber is secured to the cable with a high degree of reliability. As explained previously, the noise absorber according to the present invention can be mounted on the cable easily and quickly and affords a high degree of ease of use.

In addition, the first case member 21 is provided with cable guides 211 and 212 and the second case member 22 is provided with cable guides and 221 and 222, so that a cable can i be inserted by guiding it through the apertures formed by the cable guides 212, 221 and 211, 222 respectively. Thus, the cable insertion process is facilitated.

Furthermore, the first case member 21 and the second case member 22 are latched after the cable is inserted, without having to implement resin molding, thereby facilitating ease of use.

Also, the first case member 21 and the second case member 22 are connected by the hinge arrangement 23. The hinge arrangement 23 is provided at both sides of the second cable guide 212 and the third cable guide 221 and movably connects one side of the first case member 21 to one side of the second case member 22. Another of the two diametrical sides of the case is secured by the first and second means for interlocking. In this structure, in which the magnetic core 1 is supported by the first case member 21 and the second case member 22 formed in a cylindrical shape, the main function that the hinge arrangement 23 and the means for interlocking must fulfill, is holding the magnetic core 1. In this aspect, the case according to the present invention is very different from the case disclosed in the prior art in which a pair of split cores are placed in close contact with each other by taking advantage of the resiliency of the case. The load placed on the hinge arrangement 23 and the means for interlocking, is greatly reduced by adopting the structure in the present invention.

Furthermore, when the first and second case members 21 and 22 are secured, the hinge arrangement 23 projects out in the direction of the cable, so that the external diameter of the noise absorber according to the present invention is less than that of the noise absorber disclosed in the prior art. While the dimension of the case in the direction of the cable increases by the distance over which the hinge arrangement 23 projects out, this increase in the external dimension does not present any problem, since the cable extends out at the two sides of the case in the direction of the cable.

What's more, in this structure, projections from the external surface of the case attributable to the hinge arrangement 23 and the means for interlocking are eliminated. Thus, the noise absorber and the cable become more of an integrated unit.

Figure 19:
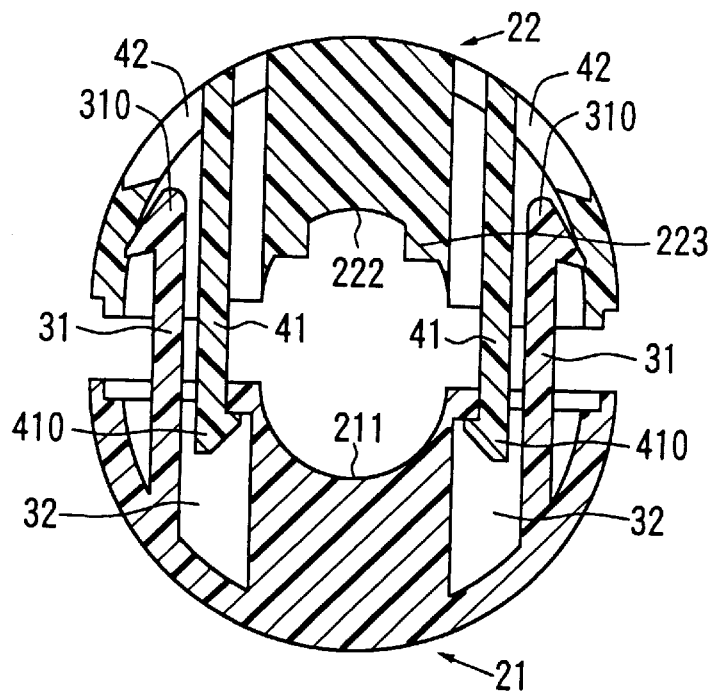
FIG. 19 is an enlarged sectional view illustrating another embodiment of a case being semi-latched
Figure 20:
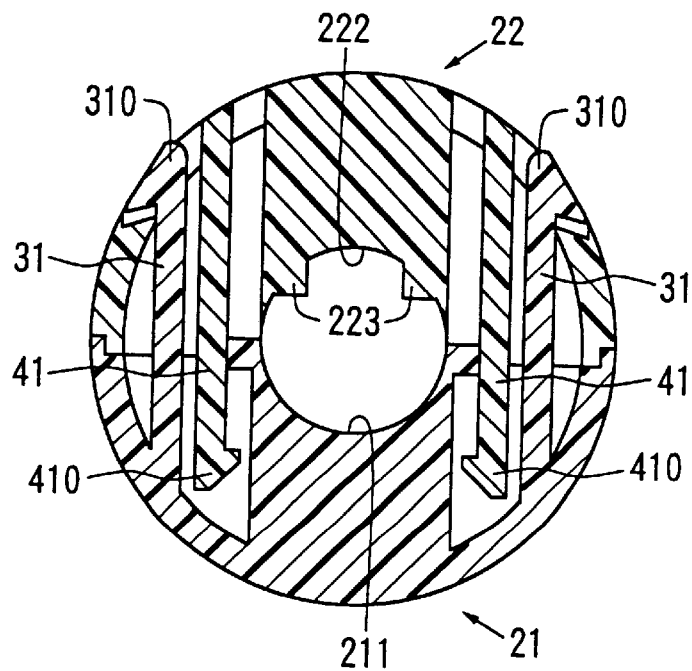
FIG. 20 is an enlarged sectional view illustrating the case of FIG. 19, being fully latched

FIGS. 19 and 20 illustrate another embodiment of the case, with the first case member 21 and second case member 22 being semi-latched in FIG. 19, and fully latched in FIG. 20. In the figures, the same reference numbers are assigned to components identical to those illustrated in the previous drawings.

Projections 410 of second hooks 41 provided at the second case member 22 are retained at protrusions located inside the first holes 32 provided at the first case member 21, and projections 310 of first hooks 31 provided at the first case member 21 are pressed into contact with the internal wall surfaces of second holes 42 provided at the second case member 22 through their own resiliency. The resiliency caused by the projections 310 at the first hooks 31 pressed into contact with the inner wall surfaces of the second holes 42 increases the force with which the projections 310 at the second hooks 41 are retained at the protrusions inside the first holes 32. Thus, the first case member 21 and the second case member 22 are semi-latched with a high degree of reliability.

Figure 21:
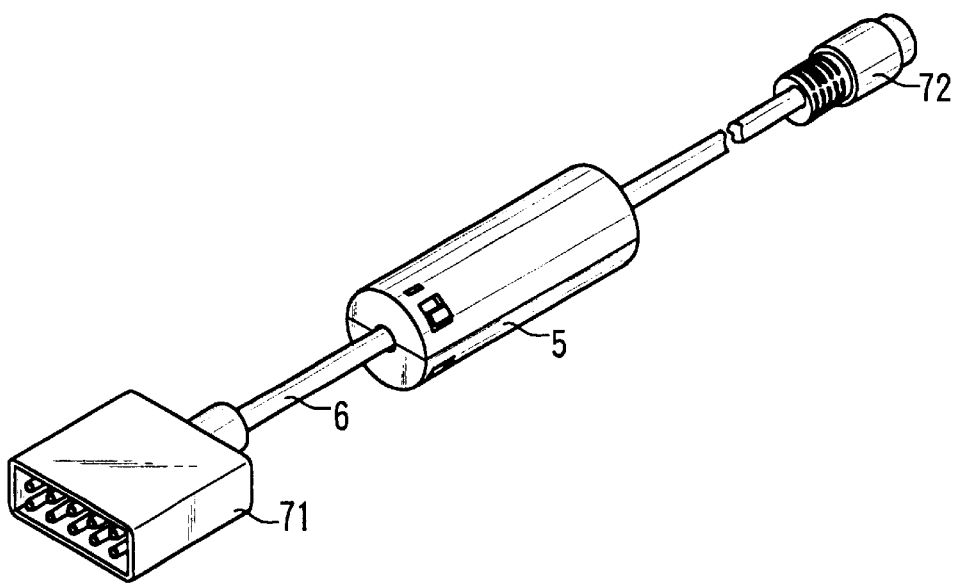
FIG. 21 is a perspective illustrating the noise absorber in an operating state.
Figure 22:
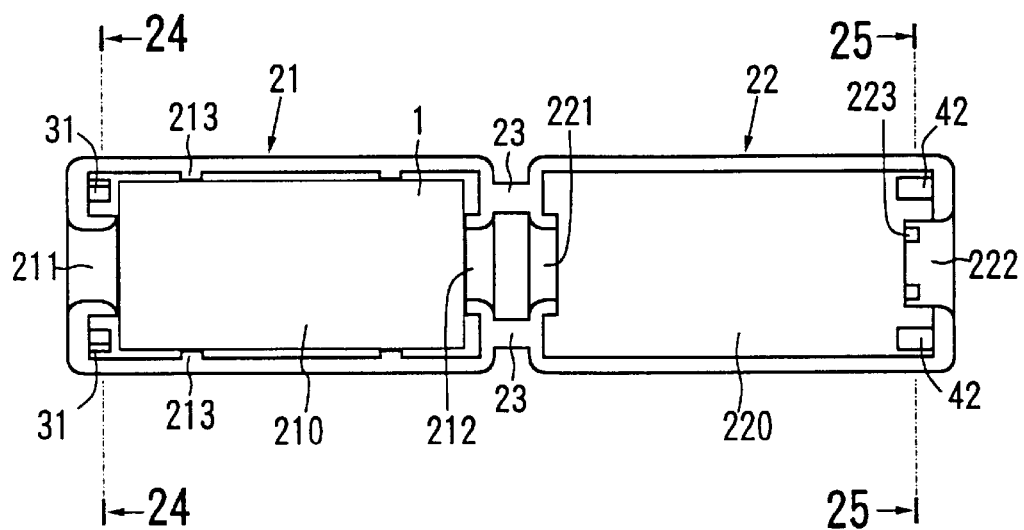
FIG. 22 is a: plan view illustrating an unlatched noise absorber in another preferred embodiment
Figure 23:
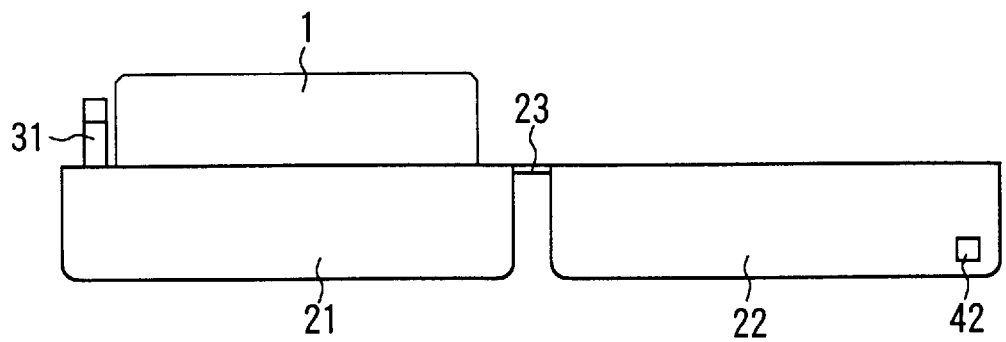
FIG. 23 is a frontal view illustrating the noise absorber of FIG. 22
Figure 24:
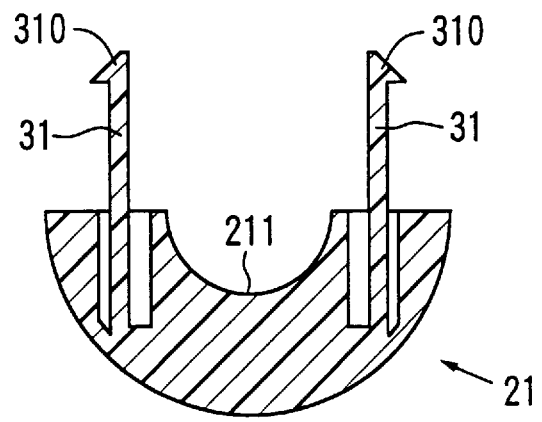
FIG. 24 is an enlarged sectional view of the noise absorber taken along line 24—24 in FIG. 22
Figure 25:
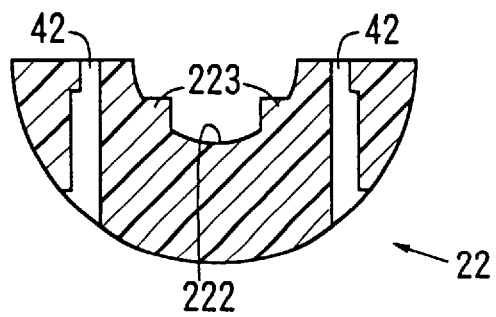
FIG. 25 is an enlarged sectional view of the noise absorber taken along line 25—25 in FIG. 22.

FIG. 21 illustrates the operating state of the noise absorber as described and illustrated in previous figures. The noise absorber 5 according to the present invention is mounted on the cable 6, with connectors 71 and 72 attached at the two ends of the cable 6. The cable 6 is connected to electronic devices (not shown) via the connectors 71 and 72.

FIGS. 22 to 25 illustrate a noise absorber in the first mode according to the present invention. In other words, a noise absorber having a case that includes a hinge arrangement. The first case member 21, which is formed in a split cylindrical shape, includes a first core housing 210 having one open end. The second case member 22, which is also formed in a split cylindrical shape, includes a second core housing 220 having one open end. The open end of the first case member 21 and the open end of the second case member 22 face each other when closing the case.

A first cable guide 211 and a second cable guide 212 are provided at opposite sides in the lengthwise direction of the first case member 21. A third cable guide 221 and a fourth cable guide 222 are provided at opposite sides in the lengthwise direction of the second case member 22. When closing the case, the opposite sides of the first case member 21 are flush with the opposite sides of the second case member 22 so that the first cable guide 211 and the fourth cable guides 222 face each other, and the second cable guide 212 and third cable guide 221 face each other so that apertures at two diametrical sides of the case are formed. The first case member and the second case member are connected by a hinge arrangement.

In the figures, the fourth cable guide 222 of the second case member 22 is provided with cable clamp portions 223 to prevent the noise absorber from moving along the cable after having been mounted. The cable clamp portions 223 in the figures merely represent an example and may take various forms other than that shown in the figures and may be provided in a sawtooth shape or constituted by changing, for instance, the curvature of the fourth cable guide 222. Only one or a plurality of cable clamp portions 223 may be provided at either the first cable guide 211 or the fourth cable guide 222, or at both the first cable guide 211 and the fourth cable guide 222. In an alternative embodiment of the case, the side of the first case member 21 where the second cable guide 212 is provided, is connected to the side of the second case member 22 where the fourth cable guide 222 is provided. Here, only one or a plurality of cable clamp portions 223 may be provided at either the first cable guide 211 or the third cable guide 221, or at both the first cable guide 211 and the third cable guide 221.

In the figures, the hinge arrangement 23 is provided at both sides of the second cable guide and the third cable guide and movably connects one of the sides of the first case member to one of the sides of the second case member. The hinge arrangement 23 is integrally formed with the first case member 21 and the second case, member 22 and is made to demonstrate a degree of flexibility by selecting an appropriate thickness. The first case member 21, the second case member 22 and the hinge arrangement 23 are all constituted of a material such as plastic.

The difference between this embodiment and the former embodiment, is that here, the case of the noise absorber is provided with a single means for interlocking.

The means for interlocking of the noise absorber in the first mode according to the present invention is constituted of hooks 31 and holes 42. The hooks 31 are each provided at one side of the first case member 21. The holes 42 are each provided at one side of the second case member 22.

This structure achieves advantages similar to those achieved in the structure explained with reference to FIGS. 1 to 21, except that semi-latching is not possible.

The noise absorber in the first mode according to the present invention employs a magnetic core 1 and projections 213, all identical to the magnetic core 1 and projections 213 of the noise absorber previously described, and further explanation is here omitted.

Figure 26:
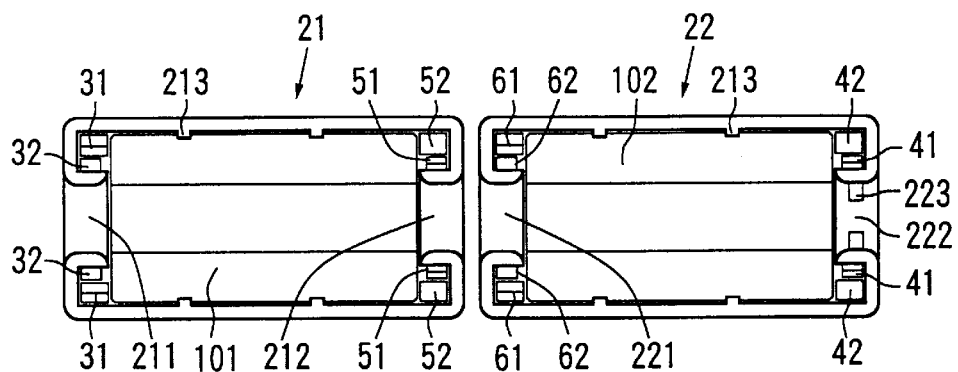
FIG. 26 is a plan view illustrating an unlatched noise absorber in still another preferred embodiment.
Figure 27:
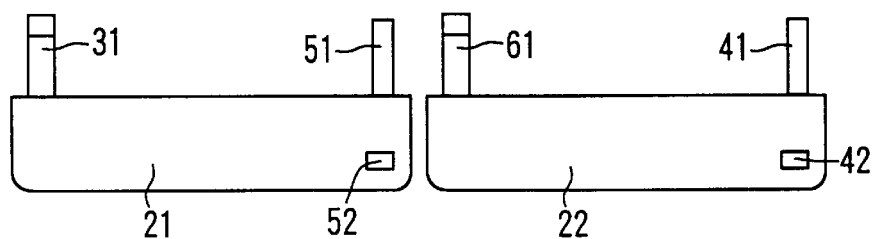
FIG. 27 is a frontal view illustrating the noise absorber of FIG. 26.
Figure 28:
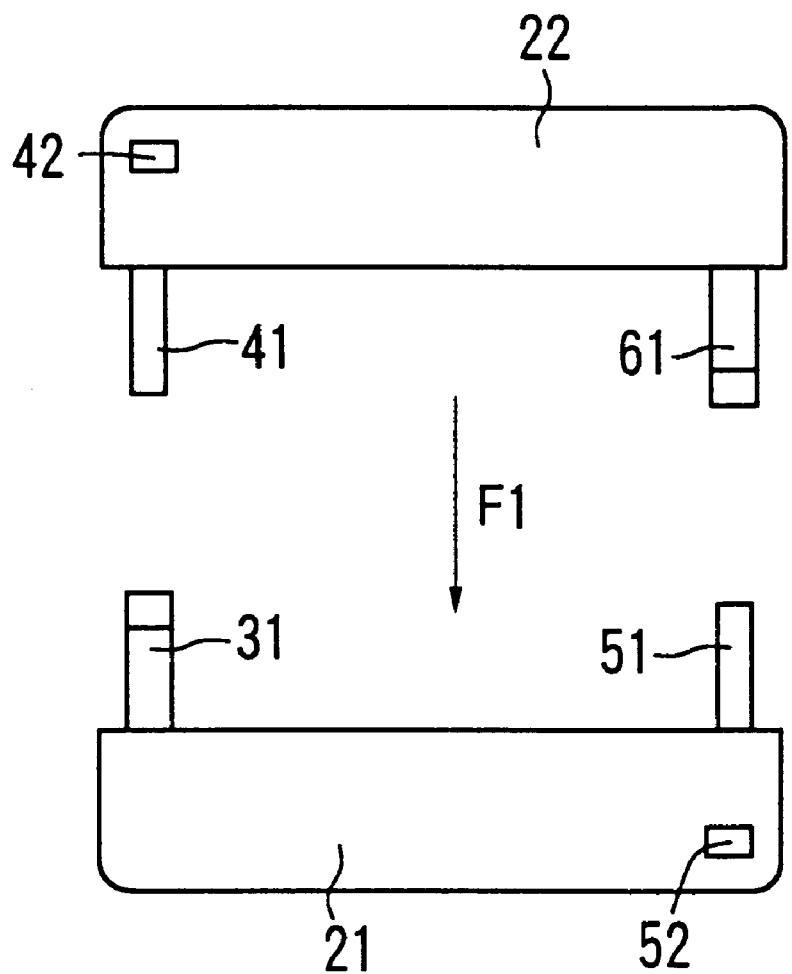
FIG. 28 illustrates the assembling method of the noise absorber of FIG. 26.

FIGS. 26 and 27 illustrate a noise absorber in the second mode according to the present invention. In other words, a noise absorber having a case that includes a first and second means for interlocking. Here, no hinge arrangement is provided, and thus, the first case member 21 and the second case member 22 are provided separately from each other.

The first case member 21, which is formed in a split cylindrical shape, includes a first core housing 210 having one open end. The second case member 22, which is also formed in a split cylindrical shape, includes a second core housing 220 having one open end. The open end of the first case member 21 and the open end of the second case member 22 face each other when closing the case.

A first cable guide 211 and a second cable guide 212 are provided at opposite sides in the lengthwise direction of the first case member 21. A third cable guide 221 and a fourth cable guide 222 are provided at opposite sides in the lengthwise direction of the second case member 22. When closing the case, the opposite sides of the first case member 21 are flush with the opposite sides of the second case member 22 so that the first cable guide 211 and the fourth cable guide 222 face each other, and the second cable guide 212 and third cable guide 221 face each other so that apertures at two diametrical sides of the case are formed.

The first case member 21 is provided with first hooks 31, first holes 32, third hooks 51 and third holes 52. The first holes 32 are each provided on either side of the first cable guide 211 and the first hooks 31 are each provided on the outside of the first holes 32. Third hooks 51 are each provided on either side of the second cable guide 212 and the third holes 52 are each provided on the outside of the third hooks 51.

The first core housing 210 is provided with four projections 213 at an open surface, to hold a split core 101. The number of projections 213 is arbitrary, but it is desirable to hold the split core 101 with projections 213 at least at diagonal points.

The second case member 22 is provided with fourth holes 62, fourth hooks 61, second hooks 41 and second holes 42. The fourth holes 62 are each provided on either side of the third cable guide 221 and the fourth hooks 61 are each provided on the outside of the fourth holes 62. The second hooks 41 are each provided on either side of the fourth cable guide 222 and the second holes 42 are each provided on the outside of the second hooks 41.

The second core housing 220 is provided with four projections 213 at an open surface, to hold a split core 102. The number of projections 213 is arbitrary, but it is desirable to hold the split core 102 with projections 213 at least at diagonal points.

In the figures, the fourth cable guide 222 of the second case member 22 is provided with cable clamp portions 223 to prevent the noise absorber from moving along the cable after having been mounted. The cable clamp portions 223 in the figures merely represent an example and may take various forms other than that shown in the figures and may be provided in a sawtooth shape or constituted by changing, for instance, the curvature of the fourth cable guide 222. Only one or a plurality of cable clamp portions 223 may be provided at any of the first cable guide 211, second cable guide 212, third cable guide 221 and fourth cable guide 222, or at a plurality of the first cable guide 211, second cable guide 212, third cable guide 221 and fourth cable guide 222.

The combination of the second hooks 41, first holes 32, fourth hooks 61 and third holes 52 constitutes the first means for interlocking and the combination of the first hooks 31, second holes 42, third hooks 51 and fourth holes 62 constitutes the second means for interlocking.

In this embodiment, the first case member 21 and the second case member 22 have a structure completely identical to each other, with the first hooks 31, the first holes 32, the third hooks 51 and the third holes 52 at the first case member 21 corresponding to the fourth hooks 61, the fourth holes 62, the second hooks 41 and the second holes 42 at the second case member 22 respectively.

FIGS. 28 to 32 illustrate a method for assembling the noise absorber of FIGS. 26 and 27. The first case member 21 and the second case member 22 are positioned to achieve symmetry with respect to each other and combined as indicated by the arrow F1. Through the symmetrical positioning shown in FIG. 28, the first hooks 31 and the third hooks 51 at the first case member 21 are made to face opposite the second holes 42 and the fourth holes 62 at the second case member 22, and the second hooks 41 and the fourth hooks 61 at the second case member 22 are made to face opposite the first holes 32 and the third holes 52 at the first case member 21 respectively.

Figure 29:
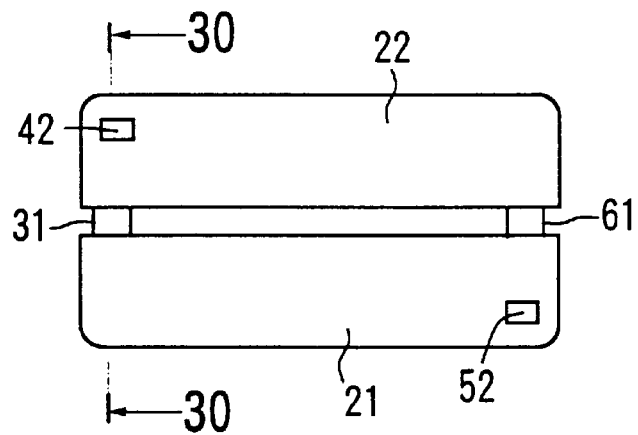
FIG. 29 is a frontal view illustrating the noise absorber of FIG. 26, in a semi-latched state.
Figure 30:
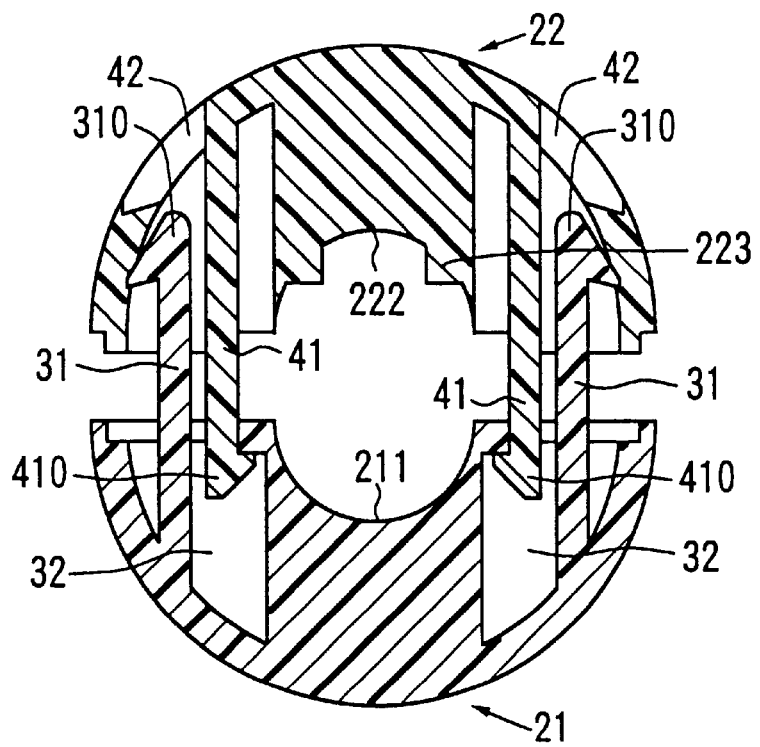
FIG. 30 is an enlarged sectional view of the noise absorber taken along line 30—30 in FIG. 29.

Referring to FIGS. 29 and 30, the first case member 21 and the second case member 22 are semi-latched. As illustrated in the figures, the first hooks 31 are inserted into the second holes 42, the second hooks 41 are inserted into the first holes 32, the third hooks 51 are inserted into the fourth holes 62, and the fourth hooks 61 are inserted into the third holes 52.

The projections 410 are retained at their front ends at the retaining portions projecting out at the inner surfaces of the first holes 32. Similarly, although not shown, the projections 510 are retained at their front ends at the retaining portions projecting out at the inner surfaces of the fourth holes 62.

The external circumferential surfaces of the projections 310 are pressed in contact with the inner surfaces of the second holes 42. Similarly, although not shown, the external circumferential surfaces of the projections 610 are pressed in contact with the inner surfaces of the third holes 52. This force with which they are pressed in contact reinforces the retaining force of the second hooks 41 and the fourth hooks 61. Thus, the first case member 21 and the second case member 22 are semi-latched in a stable manner. In this state, an aperture is formed between the first cable guide 211 and the fourth cable guide 222, and similarly, an aperture is formed between the second cable guide 212 and the third cable guide 221, so that a cable can be inserted through the noise absorber in the purchased state.

Figure 31:
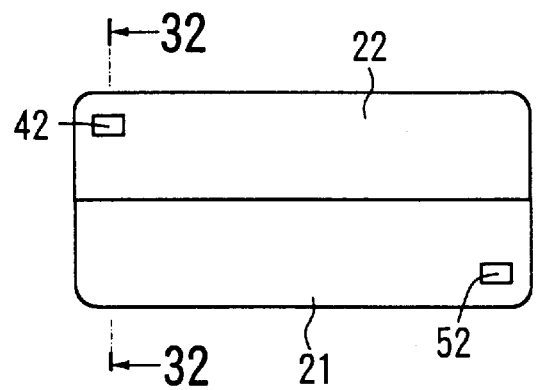
FIG. 31 is a frontal view illustrating the noise absorber of FIG. 26, in a fully latched state
Figure 32:
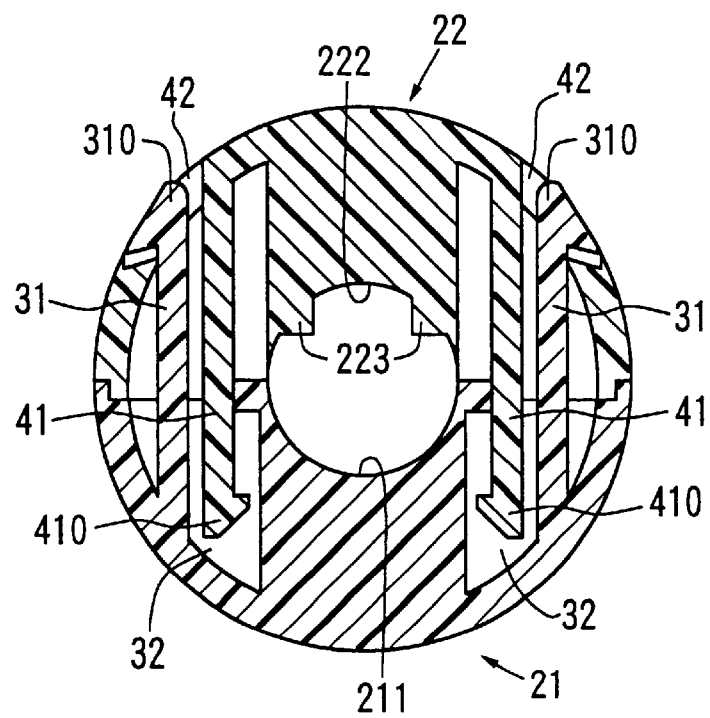
FIG. 32 is an enlarged sectional view of the noise absorber taken along line 32—32 in FIG. 31.
Figure 33:
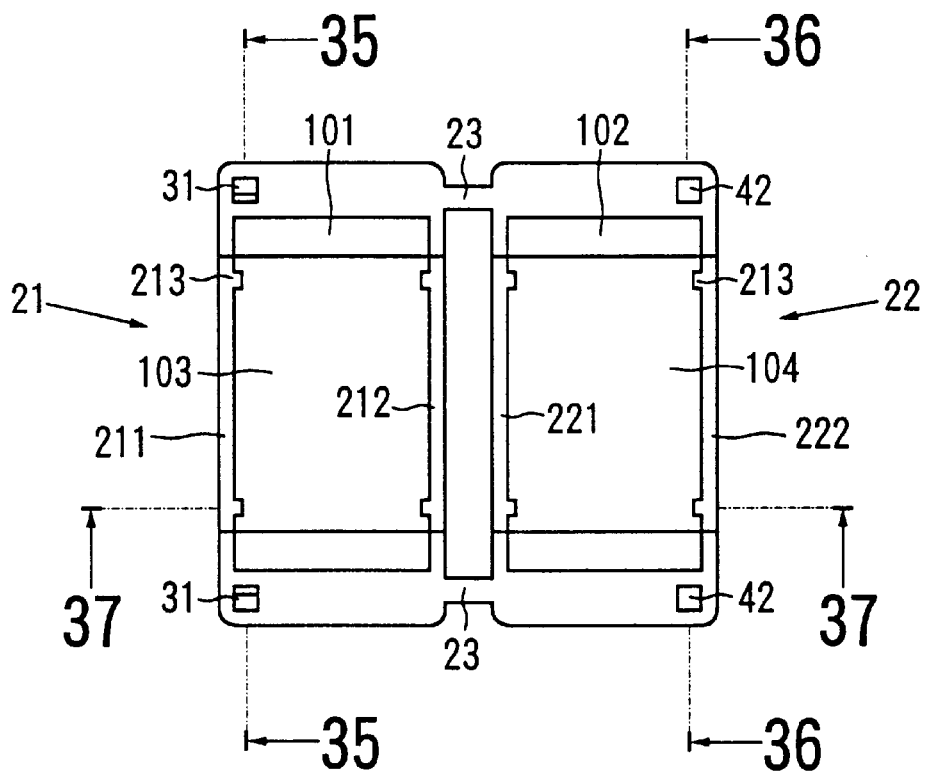
FIG. 33 is a plan view illustrating an unlatched noise absorber in still another embodiment.
Figure 34:
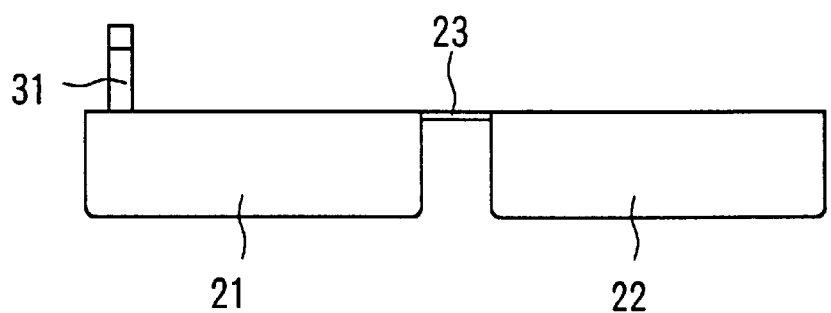
FIG. 34 is a frontal view illustrating the noise absorber of FIG. 33.
Figure 35:
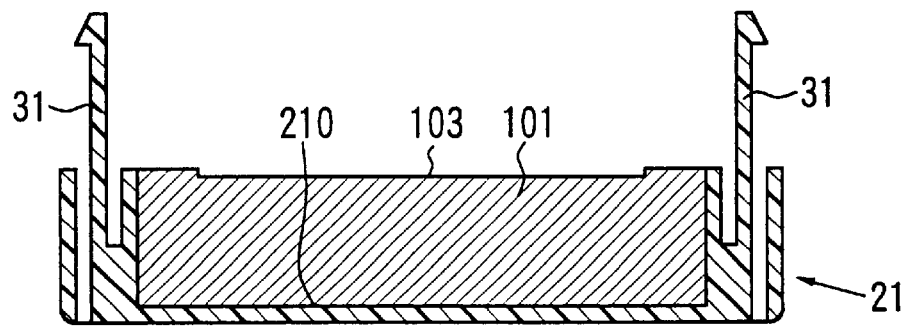
FIG. 35 is an enlarged sectional view of the noise absorber taken along line 35—35 in FIG. 33
Figure 36:
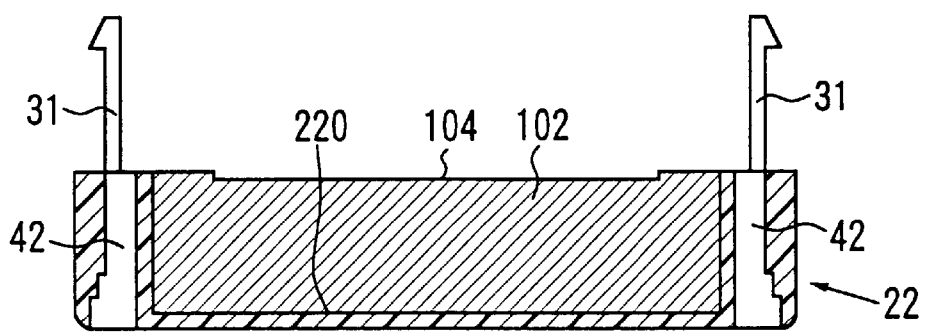
FIG. 36 is an enlarged sectional view of the noise absorber taken along line 36—36 in FIG. 33.
Figure 37:
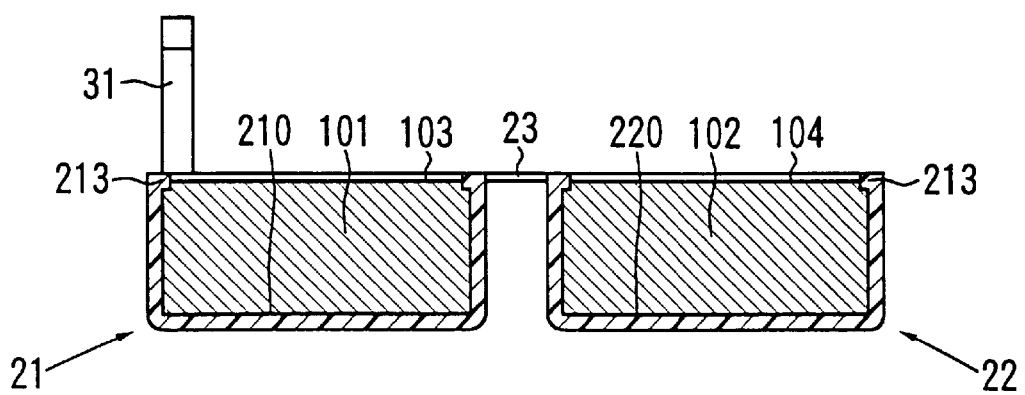
FIG. 37 is an enlarged sectional view of the noise absorber taken along line 37—37 in FIG. 33.
Figure 38:
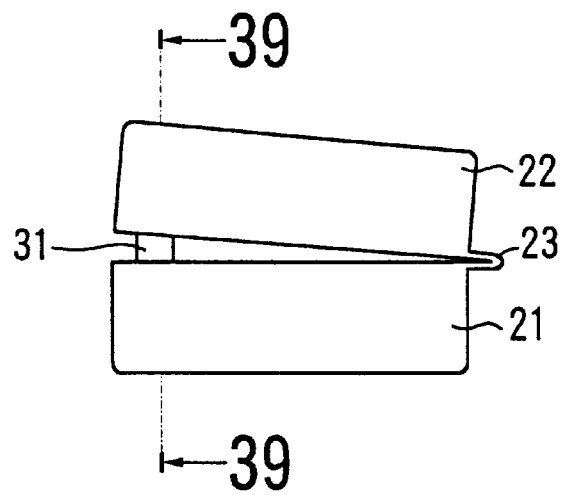
FIG. 38 is a frontal view illustrating the noise absorber of FIG. 33, in a semi-latched state
Figure 39:
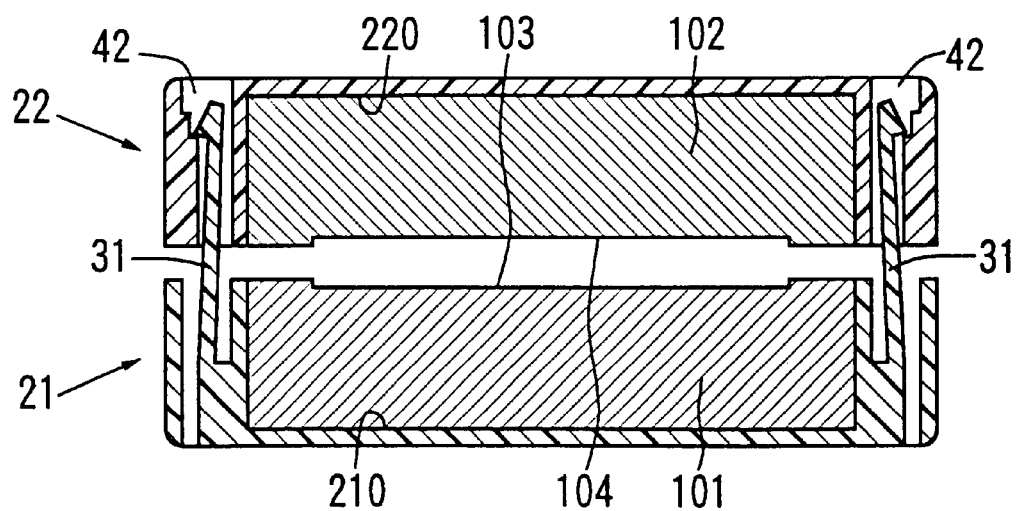
FIG. 39 is an enlarged sectional view of the noise absorber taken along line 39—39 in FIG. 38.
Figure 40:
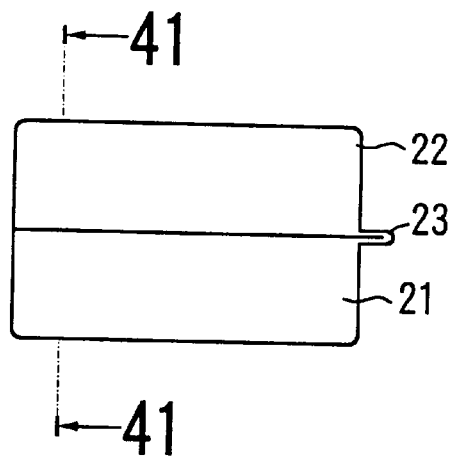
FIG. 40 is a frontal view illustrating the noise absorber of FIG. 33, in a fully latched state.
Figure 41:
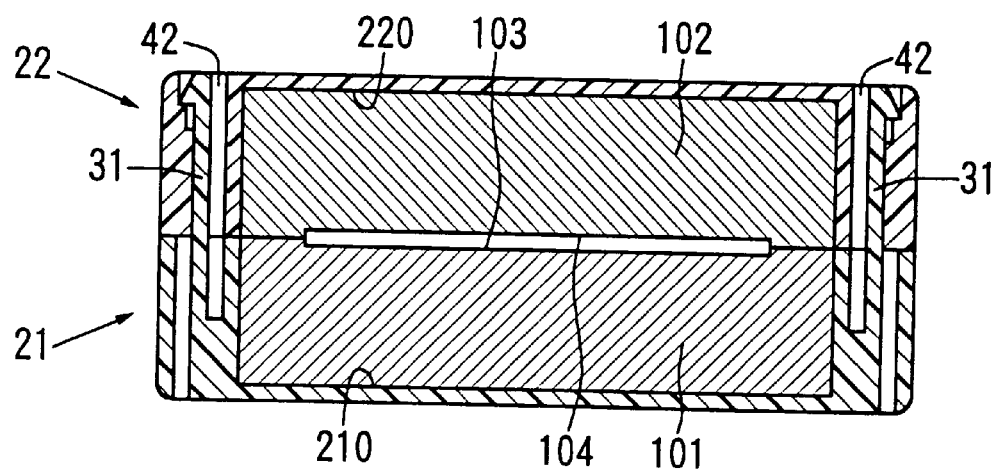
FIG. 41 is an enlarged sectional view of the noise absorber taken along lines 41—41 in FIG. 40.

Referring to FIGS. 31 and 32, the first case member 21 and the second case member 22 are fully latched. As shown in the figures, at the final latching position, the first hooks 31 are further inserted in the second holes 42, with the projections 310 at their front ends retained at the retaining portions projecting out at the inner surfaces of the second holes 42, thereby constituting the second means for interlocking. Similarly, although not shown, the third hooks 51 are further inserted in the fourth holes 62, with the projections 510 at their front ends retained at the retaining portions projecting out at the inner surfaces of the fourth holes 62, thereby constituting the second means for interlocking.

The user can then secure the noise absorber at the cable with a high degree of reliability, at a very slight angle of displacement relative to the semi-latched state achieved by the first means for interlocking. Thus, the noise absorber in the second mode can be mounted on a cable by the user easily and quickly.

Although the figures illustrate a noise absorber employing split cores, the noise absorber according to this embodiment may also employ a single core, in which case the projections 213 at the second case member 22 are not necessary.

FIGS. 33 to 41 illustrate a noise absorber for flat cables, in the first mode according to the present invention. In other words, a noise absorber having a case that includes a hinge arrangement. The first case member 21 includes a first core housing 210 having one open end. The second case member 22 includes a second core housing 220 having one open end. The open end of the first case member 21 and the open end of the second case member 22 face each other when closing the case.

A first cable guide 211 and a second cable guide 212 are provided at opposite sides of the first case member 21. A third cable guide 221 and a fourth cable guide 222 are provided at opposite sides of the second case member 22. When closing the case, the opposite sides: of the first case member 21 are flush with the opposite sides of the second case member 22 so that the first cable guide 211 and the fourth cable guides 222 face each other, and the second cable guide 212 and third cable guide 221 face each other so that apertures at two diametrical sides of the case are formed.

The hinge arrangement 23 is provided at both sides of the second cable guide 212 and the third cable guide 221 and movably connects one side of the first case member 21 to one side of the second case member 22, is integrally formed with the first case member 21 and the second case member 22 and is made to demonstrate a degree of flexibility by selecting an appropriate thickness. The first case member 21, the second case member 22 and the hinge arrangement 23 are all constituted of a material such as plastic.

Furthermore, when the first and second case members 21 and 22 are secured, the hinge arrangement 23 projects out in the direction of the flat cable, so that the external diameter of the noise absorber according to the present invention is less than that of noise absorbers disclosed in the prior art. While the dimension of the case in the direction of the flat cable increases by the distance over which the hinge arrangement 23 projects out, this increase in the external dimension does not present any problem, since the flat cable extends out at the two sides of the case in the direction of the flat cable.

The first case member 21 is provided with hooks 31 and the second case member 22 is provided with holes 42. The hooks 31 of the first case member 21 and the holes 42 of the second case member 22 constitute the means for interlocking the noise absorber according to the present invention. The means for interlocking as described above latches the first case member 21 and the second case member 22.

The split cores 101 and 102 retained by the projections 213 of the first case member 21 and the second case member 22 respectively, have a rectangular shape that corresponds with the rectangular shape: of the first and second core housings 210 and 220. The split cores 101 and 102 are provided with a recess 103 and 104 respectively and when the first case member 21 and the second case member 22 are latched by the means for interlocking as described, these recesses 103 and 104 face each other so as to form an elongated gap between the split cores 101 and 102 (see FIG. 41).

Before latching the first case member 21 and the second case member 22, a flat cable may be inserted between the split cores 101 and 102. When a desired position of the noise absorber has been determined, the first case member 21 and the second case member 22 are latched by the means for interlocking comprising the hooks 31 and the holes 42.

Although the figures illustrate a noise absorber employing split cores 101, 102, the noise absorber according to this embodiment may also employ a single core, in which case the projections 213 at the second case member 22 are not necessary.

Figure 42:
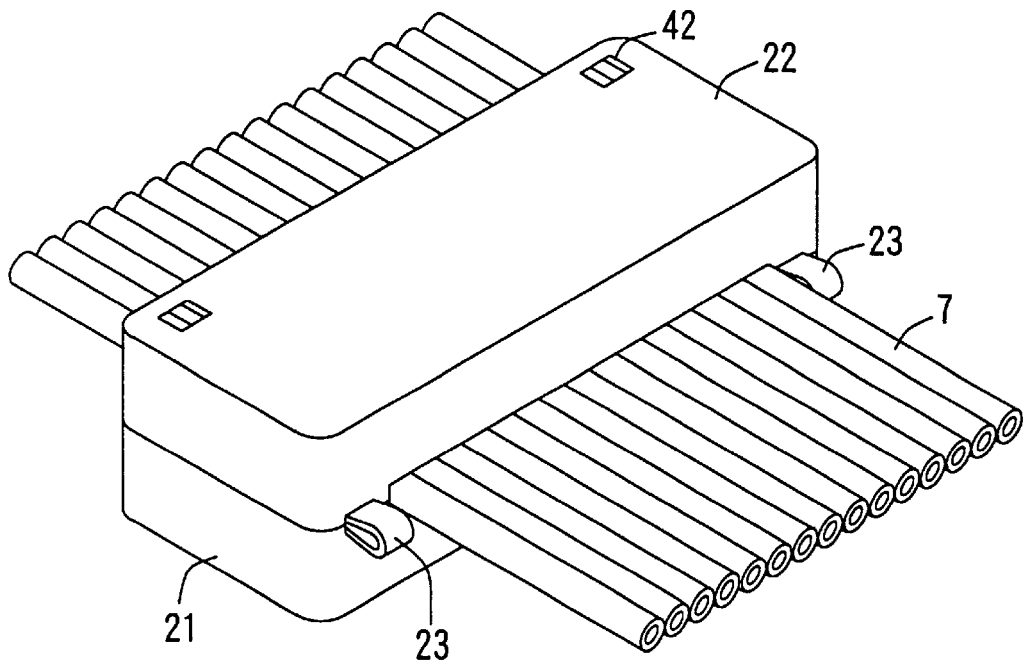
FIG. 42 is a perspective illustrating the noise absorber of FIG. 33 in an operating state.
Figure 43:
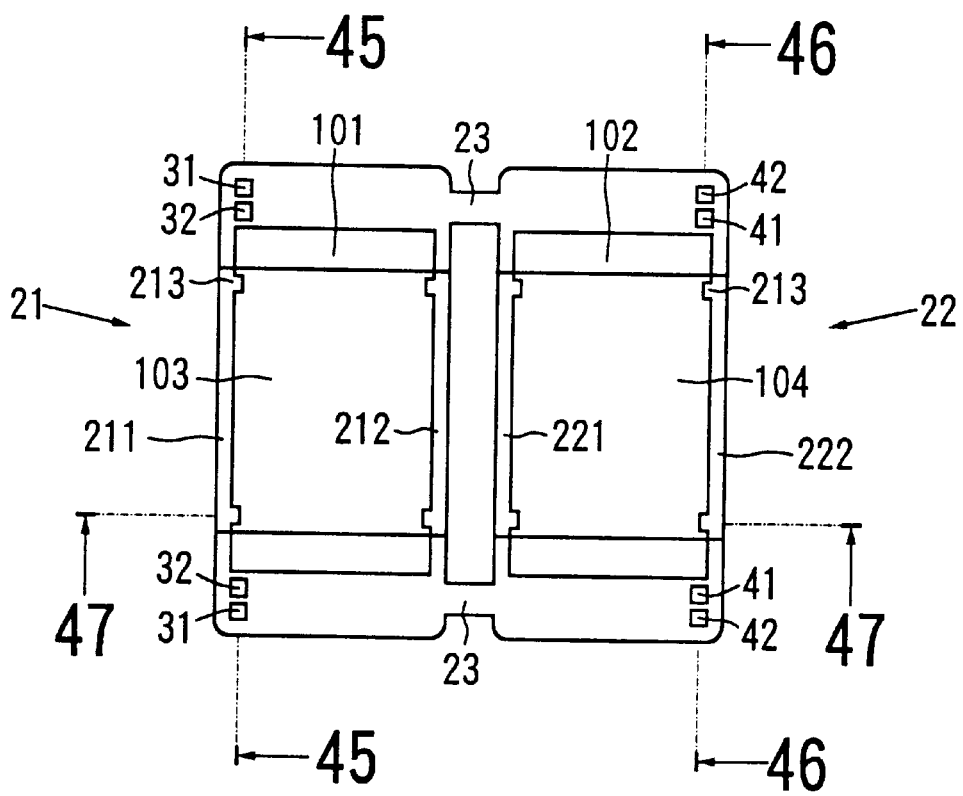
FIG. 43 is a plan view illustrating an unlatched noise absorber in still another preferred embodiment
Figure 44:
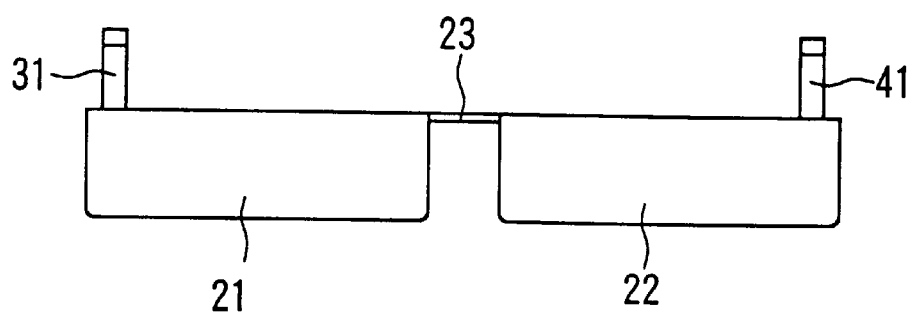
FIG. 44 is a frontal view illustrating the noise absorber of FIG. 43.
Figure 45:
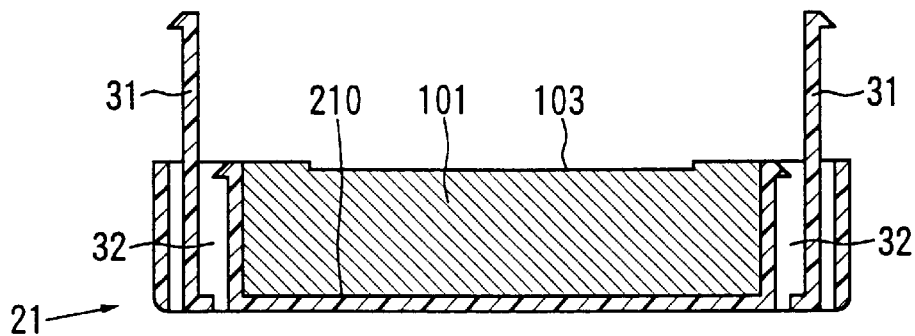
FIG. 45 is an enlarged sectional view of the noise absorber taken along line 45—45 in FIG. 43
Figure 46:
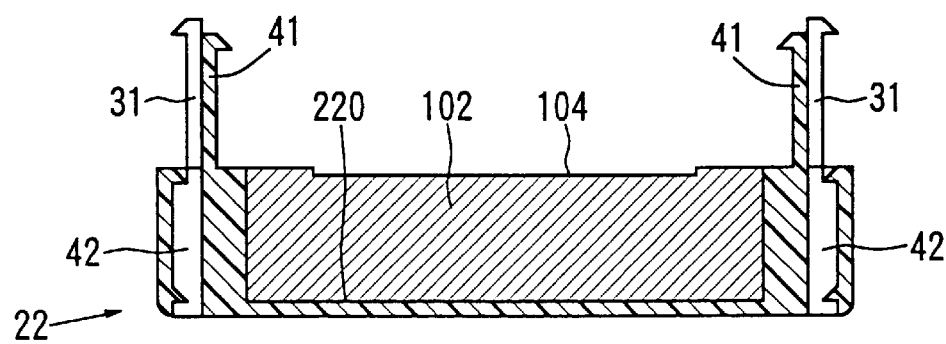
FIG. 46 is an enlarged sectional view of the noise absorber taken along line 46—46 in FIG. 43
Figure 47:
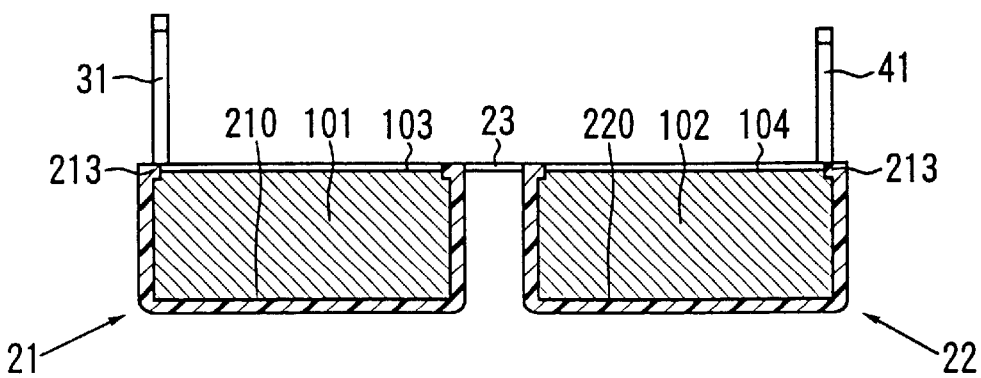
FIG. 47 is an enlarged sectional view of the noise absorber taken along line 47—47 in FIG. 43.

FIG. 42 illustrates the noise absorber for flat cables according to the first mode of the present invention in a mounted state onto a flat cable 7.

FIGS. 43 to 51 illustrate a noise absorber for a flat cable, in both the first and second mode according to the present invention. In other words, a noise absorber having a case including a hinge arrangement and a first and second means for interlocking. The first case member 21 is internally provided with a first core housing 210 and projections 213 at an open surface. The projections 213 are provided to retain a split core 101 inside the first core housing 210. The second case member 22 is internally provided with a second core housing 220 and projections 213 at an open surface. The projections 213 are provided to retain a split core 102 inside the second core housing 220.

The hinge arrangement 23 is provided at both sides of the second cable guide and the third cable guide and movably connects one side of the first case member to one side of the second case member, is integrally formed with the first case member 21 and the second case member 22 and is made to demonstrate a degree of flexibility by selecting an appropriate thickness. The first case member 21, the second case member 22 and the hinge arrangement 23 are all constituted of a material such as plastic.

Furthermore, when the first and second case members 21 and 22 are secured, the hinge arrangement 23 projects out in the direction of the flat cable, so that the external diameter of the noise absorber according to the present invention is less than that of the noise absorber disclosed in the prior art. While the dimension of the case in the direction of the flat cable increases by the distance over which the hinge arrangement 23 projects out, this increase in the external dimension does not present any problem, since the flat cable extends out at the two sides of the case in the direction of the flat cable.

In addition, the first case member 21 is provided with hooks 31 and holes 32, whereas the second case member 22 is provided with hooks 41 and holes 42. The hooks 41 of the second case member 22 and the holes 32 of the first case member 21 constitute the first means for interlocking of the noise absorber. The hooks 31 of the first case member 21 and the holes 42 of the second case member 22 constitute the second means for interlocking of the noise absorber.

The split cores 101 and 102 retained by the projections 213 of the first case member 21 and the second case member 22 respectively, have a rectangular shape that corresponds with the rectangular shape of the first and second core housings 210 and 220. The split cores 101 and 102 are provided with a recess 103 and 104 respectively and when the first case member 21 and the second case member 22 are latched by the means for interlocking as described, these recesses 103 and 104 face each other so as to form an elongated gap between the split cores 101 and 102 (see FIG. 51).

Before latching the first case member 21 and the second case member 22, a flat cable may be inserted between the split cores 101 and 102.

Figure 48:
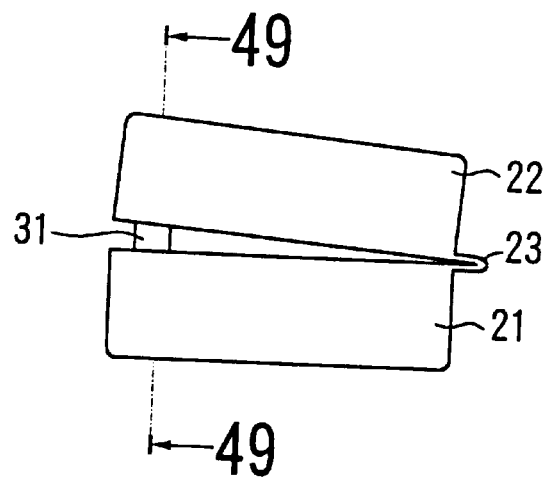
FIG. 48 is a frontal view illustrating the noise absorber of FIG. 43, in a semi-latched state
Figure 49:
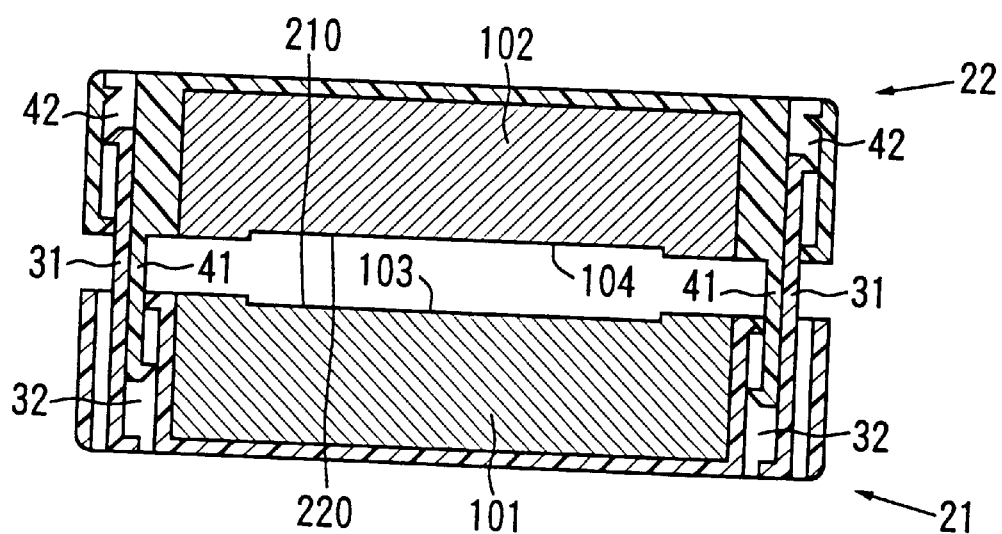
FIG. 49 is an enlarged sectional view of the noise absorber taken along line 49—49 in FIG. 48.
Figure 50:
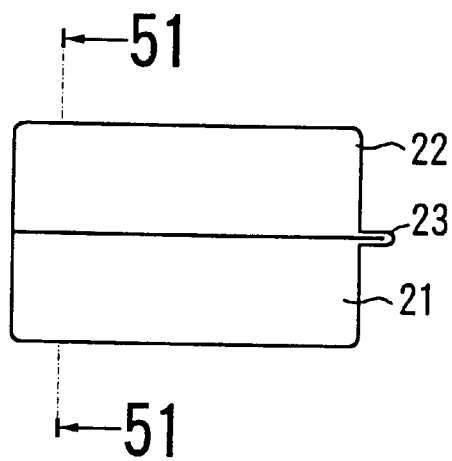
FIG. 50 is a frontal view illustrating the noise absorber of FIG. 43, in a fully latched state
Figure 51:
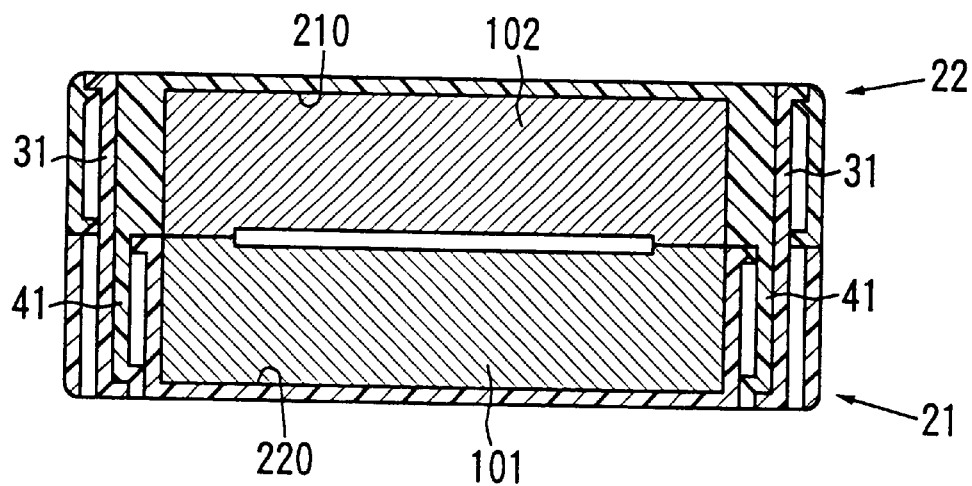
FIG. 51 is an enlarged sectional view of the noise absorber taken along line 51—51 in FIG. 50.
Figure 52:
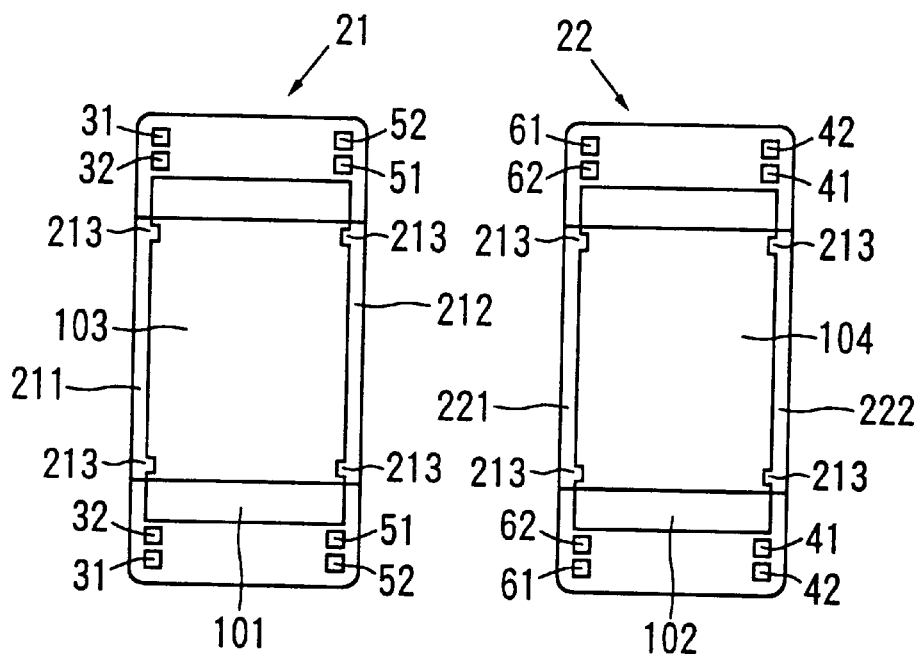
FIG. 52 is a plan view illustrating an unlatched noise absorber in still another preferred embodiment.
Figure 53:
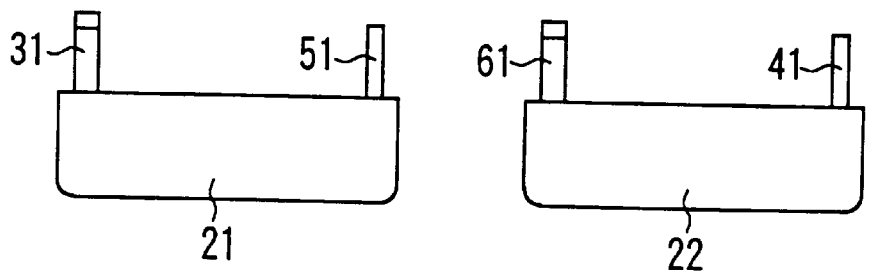
FIG. 53 is a frontal view illustrating the noise absorber of FIG. 52.

Now in reference to FIGS. 48 to 51, the first means for interlocking and the second means for interlocking are explained. FIGS. 48 and 49 illustrate the noise absorber shown in FIG. 43 being semi-latched and FIGS. 50 and 51 illustrate the noise absorber shown in FIG. 43 being fully latched.

The first means for interlocking is employed to semi-latch the first case member 21 and the second case member 22. In more specific terms, the first means for interlocking is constituted through the combination of hooks 41 of the second case member 22 and holes 32 of the first case member 21.

The second means for interlocking is employed to latch the first case member 21 and the second case member 22 fully. In more specific terms, the second means for interlocking is constituted through the combination of hooks 31 of the first case member 21 and holes 42 of the second case member 22.

Further explanation of the first means for interlocking and the second means for interlocking is omitted here since they have already been described.

Although the drawings illustrate a noise absorber employing split cores 101, 102, the noise absorber according to this embodiment may also employ a single core, in which case the projections 213 at the second case member 22 are not necessary.

FIGS. 52 to 57 illustrate a noise absorber in the second mode according to the present invention. In other words, a noise absorber having a case including a first and second means for interlocking. The first case member 21 is internally provided with a first core housing 210 and projections 213 at an open surface. The projections 213 are provided to retain a split core 101 inside the first core housing 210. The second case member 22 is internally provided with a second core housing 220 and projections 213 at an open surface. The projections 213 are provided to retain a split core 102 inside the second core housing 220.

The first case member 21 is provided with first hooks 31, third hooks 51, first holes 32 and third holes 52, whereas the second case member 22 is provided with second hooks 41, fourth hooks 61, second holes 42 and fourth holes 62.

The second hooks 41, first holes 32, fourth hooks 61 and third holes 52 constitute the first means for interlocking. The first hooks 31, second holes 42, third hooks 51 and fourth holes 62 constitute the second means for interlocking of the noise absorber.

The split cores 101 and 102 retained by the projections 213 of the first case member 21 and the second case member 22 respectively, have a rectangular shape that corresponds with the rectangular shape of the first and second core housings 210 and 220. The split cores 101 and 102 are provided with a recess 103 and 104 respectively and when the first case member 21 and the second case member 22 are latched by the means for interlocking as described, these recesses 103 and 104 face each other so as to form an elongated gap for passing through of a flat cable between the split cores 101 and 102 (see FIG. 57).

Before latching the first case member 21 and the second case member 22, a flat cable may be inserted between the split cores 101 and 102.

Figure 54:
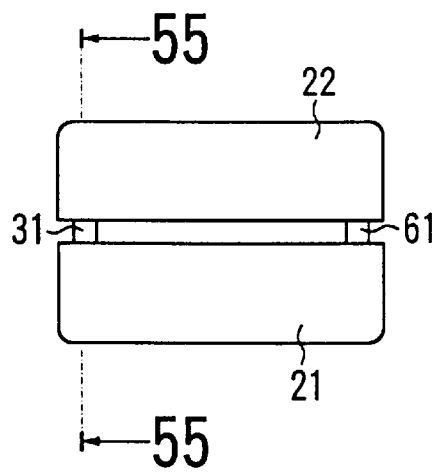
FIG. 54 is a frontal view illustrating the noise absorber of FIG. 52, in a semi-latched state
Figure 55:
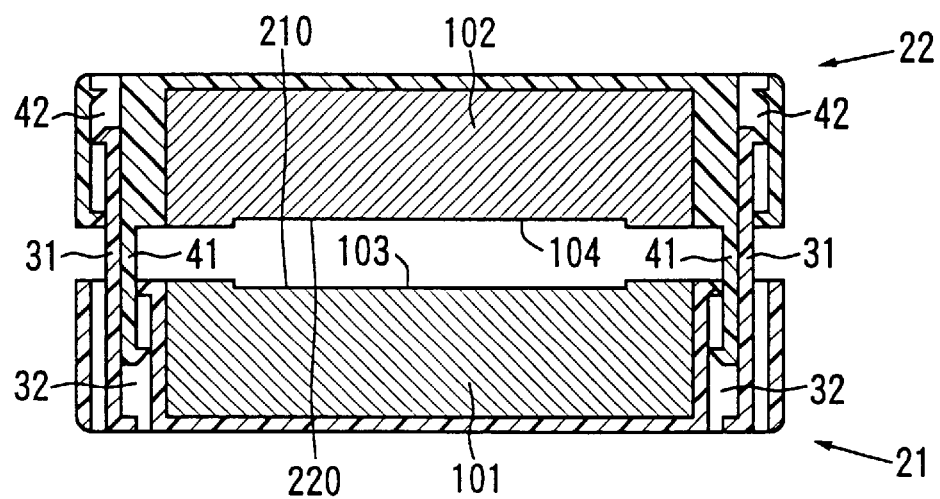
FIG. 55 is an enlarged sectional view of the noise absorber taken along line 55—55 in FIG. 54
Figure 56:
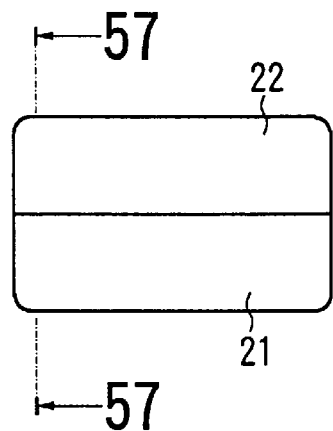
FIG. 56 is a frontal view illustrating the noise absorber of FIG. 52, in a fully latched state.
Figure 57:
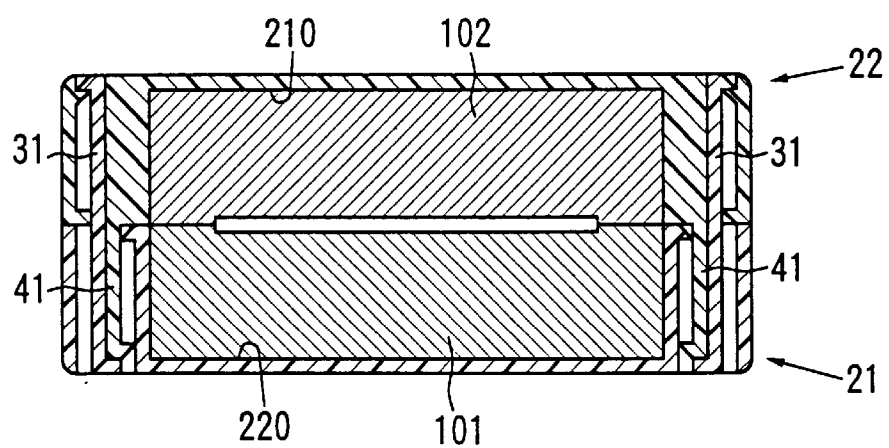
FIG. 57 is an enlarged sectional view of the noise absorber taken along line 57—57 in FIG. 56.

Now in reference to FIGS. 54 to 57, the first means for interlocking and the second means for interlocking are explained. FIGS. 54 and 55 illustrate the noise absorber shown in FIG. 52 being semi-latched and FIGS. 56 and 57 illustrate the noise absorber shown in FIG. 52 fully latched.

The noise absorber shown in FIGS. 54 and 55 is in a state in which it is semi-latched by the first means for interlocking. As shown, the second hooks 41 of the second case member 22 mate with the first holes 32 of the first case member 21. Similarly, but not shown, the third hooks 51 of the first case member 21 mate with the fourth holes 62 of the second case member 22.

The noise absorber shown in FIGS. 56 and 57 is in a state in which it is secured by the second means for interlocking. As shown, the first hooks 31 of the first case member 21 mate with the second holes 42 of the second case member 22. Similarly, but not shown, the fourth hooks 61 of the second case member 22 mate with the third holes 52 of the first case member 21.

Further explanation of the first means for interlocking and the second means for interlocking is omitted here since they have already been described.

Although the drawings illustrate a noise absorber employing split cores, the noise absorber according to this embodiment may also employ a single core, in which case the projections 213 at the second case member 22 are not necessary.

Figure 58:
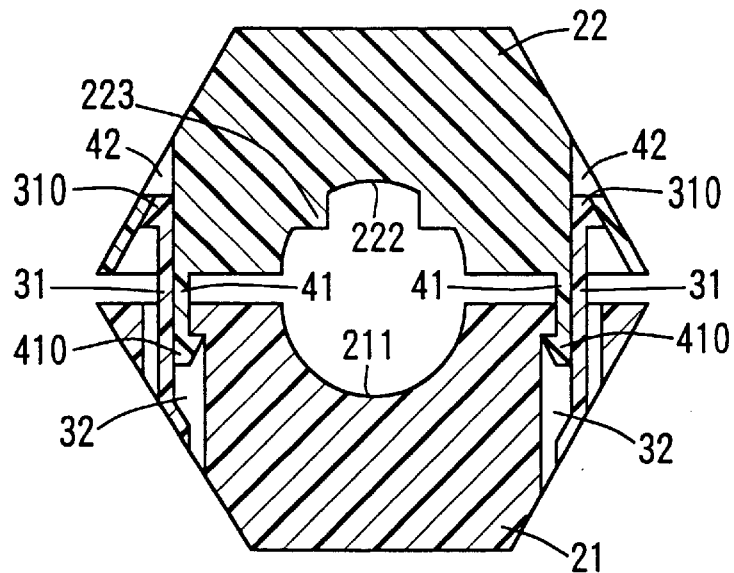
FIG. 58 is an enlarged sectional view illustrating a semi-latched case in still another preferred embodiment.

FIG. 58 illustrates another embodiment of a case, where the combination of the first case member 21 and the second case member 22 when latched, forms a hexagon while providing a case that comprises a first case member 21, a second case member 22, a first means for interlocking and a second means for interlocking.

Figure 59:
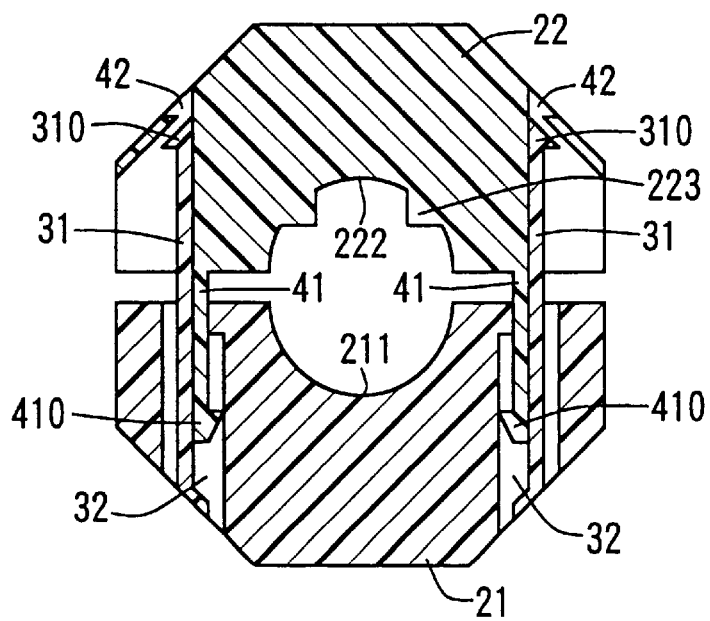
FIG. 59 is an enlarged sectional view illustrating a semi-latched case in still another preferred embodiment.

FIG. 59 illustrates yet another embodiment of a case, where the combination of the first case member 21 and the second case member 22 when latched, forms a octagon while providing a case that comprises a first case member 21, a second case member 22, a first means for interlocking and a second means for interlocking.

Referring back to FIGS. 1, 10 and 43, the first case member 21 and the second case member 22 are secured by a double latching mechanism. As an alternative to the number of hooks and holes, the first case member 21 may be provided with only one first hook 31 and one first hole 32 and the second case member 22 may be provided with only one second hook 41 and one second hole 42. The case can be semi-latched by inserting the single second hook 41 into the single first hole 32. The case can be fully-latched by pushing the first and second case members 21 and 22 together. Adopting this structure provides for an even more economical case and noise absorber since the number of hooks is reduced by half thereby automatically reducing the amount of material needed to manufacture the case.

Referring back to FIGS. 26 and 52, the first case member 21 and the second case member 22 are secured by a double latching mechanism. As an alternative to the number of hooks and holes, the first case member 21 may be provided with only one first hook 31, one third hook 51, one first hole 32 and one third hole 52, and the second case member 22 may be provided with only one second hook 41, one fourth hook 61, one second hole 42 and one fourth hole 62. The case can be semi-latched by inserting the single second hook 41 into the single first hole 32 while inserting the single third hook 51 into the single fourth hole 62. The case can be fully-latched by pushing the first and second case members 21 and 22 together. Adopting this structure provides for an even more economical case and noise absorber since the number of hooks is reduced by half thereby automatically reducing the amount of material needed to manufacture the case.

Although not shown in the figures, as long as the case and noise absorber in the second mode according to the present invention comprises the first and second means for interlocking, the hinge arrangement 23 does not necessarily be situated as illustrated. Instead, the hinge arrangement may take on a structure as disclosed in the prior art, where the hinge arrangement is situated at the circumferential surface of the case.

What is claimed is:

1. A case for a noise absorber comprising:
   a first case member having first and second sides and including a first cable guide at said first side, a second cable guide at said second side, and a first core housing provided therebetween;
   a second case member having first and second sides and including a third cable guide at said first side, a fourth cable guide at said second side, and a second core housing provided therebetween;
   a means for interlocking which secures said first case member and said second case member; and
   a hinge arrangement movably connecting said second side of said first case member where said second cable guide is provided with said first side of said second case member where said third cable guide is provided.

2. The case for a noise absorber according to claim 1, wherein at least one of said first cable guide and said fourth cable guide is provided with at least one cable clamp portion.

3. The case for a noise absorber according to claim 1, wherein a length of said first core housing is less than a length of said second core housing.

4. A case for a noise absorber comprising:
   a first case member having first and second sides and including a first cable guide at said first side, a second cable guide at said second side, and a first core housing provided therebetween;
   a second case member having first; and second sides and including a third cable guide at said first side, a fourth cable guide at said second side, and a second core housing provided therebetween; and
   a first means for interlocking and a second means for interlocking which secure said first case member and said second case member, said first means for interlocking securing said first case member and said second case member partially, and said second means for interlocking securing said first case member and said second case member entirely, wherein:
   said first case member comprises two hooks and two holes, with said two holes of said first case member being situated at each side of the first cable guide and said two hooks of said first case member being situated at each side of said two holes of said first case member, and said second case member comprises two hooks and two holes, with said two hooks of said second case member being situated at each side of said fourth cable guide and said two holes of said second case member being situated at each side of said two hooks of said second case member.

5. The case for a noise absorber according to claim 4, wherein said first means for interlocking is constituted through the combination of said two hooks of said second case member and said two holes of said first case member, and said second means for interlocking is constituted through the combination of said two hooks of said first case member and said two holes of said second case member.

6. The case for a noise absorber according to claim 4, wherein:

said two hooks of said first case member are provided with projecting pieces at a front end thereof, so that said projecting pieces of said two hooks of said first case member are latched at said two holes of said second case member, and said two hooks of said second case member are provided with projecting pieces at a front end thereof, so that said projecting pieces of said two hooks of said second case member are latched at said two holes of said first case member.

7. The case for a noise absorber according to claim 4, further comprising:

a hinge arrangement movably connecting said second side of said first case member where said second cable guide is provided with said first side of second case member where said third cable guide is provided.

8. The case for a noise absorber according to claim 4, wherein at least one of said first cable guide and said fourth cable guide is provided with at least one cable clamp portion.

9. The case for a noise absorber according to claim 4, wherein a length of said first core housing is less than a length of said second core housing.

10. A noise absorber comprising:

a case and a magnetic core housed inside said case, said magnetic core provided with a cable through passage and said case including:

a first case member having first and second sides and including a first cable guide at said first side, a second cable guide at said second side, and a first core housing provided therebetween;

a second case member having first and second sides and including a third cable guide at said first side, a fourth cable guide at said second side, and a second core housing provided therebetween;

a means for interlocking which secures said first case member and said second case member; and a hinge arrangement movably connecting said second side of said first case member where said second cable guide is provided with said first side of said second case member where said third cable guide is provided.

11. The noise absorber according to claim 10, wherein at least one of said first cable guide and said fourth cable guide is provided with at least one cable clamp portion.

12. The noise absorber according to claim 10, wherein a length of said first core housing is less than a length of said second core housing.

13. A noise absorber comprising:

a case and a magnetic core housed inside said case, said magnetic core provided with a cable through passage and said case including:

a first case member having first and said second sides and including a first cable guide at said first side, a second cable guide at said second side, and a first core housing provided therebetween;

a second case member having first and second sides and including a third cable guide at said first side, a fourth cable guide at said second side, and a second core housing provided therebetween; and a first means for interlocking and a second means for interlocking which secure said first case member and said second case member, said first means for interlocking securing said first case member and said second case member partially, and said second means for interlocking securing said first case member and said second case member entirely wherein:

said first case member comprises two hooks and two holes, with said two holes of said first case member being situated at each side of said first cable guide and said two hooks of said first case member being situated at each side of said two holes of said first case member, and said second case member comprises two hooks and two holes, with said two hooks of said second case member being situated at each side of said fourth cable guide and said two holes of said second case member being situated at each side of said two hooks of said second case member.

14. The noise absorber according to claim 13, wherein:

said first means for interlocking is constituted through the combination of said two hooks of said second case member and said two holes of said first case member; and said second means for interlocking is constituted through the combination of said two hooks of said first case member and said two holes of said second case member.

15. The noise absorber according to claim 13, wherein:

said two hooks of said first case member are provided with projecting pieces at a front end thereof, so that said projecting pieces of said two hooks of said first case member are latched at said two holes of said second case member; and said two hooks of said second case member are provided with projecting pieces at a front end thereof, so that said projecting pieces of said two hooks of said second case member are latched at said two holes of said first case member.

16. The noise absorber according to claim 13, further comprising:

a hinge arrangement movably connecting said second side of said first case member where said second cable guide is provided with said first side of said second case member where said third cable guide is provided.

17. The noise absorber according to claim 13, wherein at least one of said first cable guide and said fourth cable guide is provided with at least one cable clamp portion.

18. The noise absorber according to claim 13, wherein a length of said first core housing is less than a length of said second core housing.

* * * * *